US010692847B2

(12) United States Patent
Sobieski et al.

(10) Patent No.: US 10,692,847 B2
(45) Date of Patent: Jun. 23, 2020

(54) INORGANIC INTERPOSER FOR MULTI-CHIP PACKAGING

(71) Applicant: Intel Corporation, Santa Clara, CA (US)

(72) Inventors: Daniel Sobieski, Phoenix, AZ (US); Kristof Darmawikarta, Chandler, AZ (US); Sri Ranga Sai Boyapati, Chandler, AZ (US); Merve Celikkol, Chandler, AZ (US); Kyu Oh Lee, Chandler, AZ (US); Kemal Aygun, Tempe, AZ (US); Zhiguo Qian, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,533

(22) PCT Filed: Aug. 31, 2015

(86) PCT No.: PCT/US2015/047811
§ 371 (c)(1),
(2) Date: Feb. 26, 2018

(87) PCT Pub. No.: WO2017/039628
PCT Pub. Date: Mar. 9, 2017

(65) Prior Publication Data
US 2018/0240788 A1    Aug. 23, 2018

(51) Int. Cl.
*H01L 25/18* (2006.01)
*H01L 23/14* (2006.01)
(Continued)

(52) U.S. Cl.
CPC ............ *H01L 25/18* (2013.01); *H01L 23/147* (2013.01); *H01L 23/5383* (2013.01);
(Continued)

(58) Field of Classification Search
None
See application file for complete search history.

(56) References Cited

U.S. PATENT DOCUMENTS 8,519,543 B1 * 8/2013 Song ...................... H01L 24/17
257/774
8,913,402 B1 12/2014 Berg et al.
(Continued)

FOREIGN PATENT DOCUMENTS

CN          108369940          8/2018
WO     WO-2017039628 A1       3/2017

OTHER PUBLICATIONS

"International Application Serial No. PCT/US2015/047811, International Search Report dated May 30, 2016", 3 pgs.
(Continued)

*Primary Examiner* — Bilkis Jahan
(74) *Attorney, Agent, or Firm* — Schwegman Lundberg & Woessner, P.A.

(57) ABSTRACT

Discussed generally herein are methods and devices for multichip packages that include an inorganic interposer. A device can include a substrate including low density interconnect circuitry therein, an inorganic interposer on the substrate, the inorganic interposer including high density interconnect circuitry electrically connected to the low density interconnect circuitry, the inorganic interposer including inorganic materials, and two or more chips electrically connected to the inorganic interposer, the two or more chips electrically connected to each other through the high density interconnect circuitry.

9 Claims, 28 Drawing Sheets

(51) Int. Cl.
*H01L 25/065* (2006.01)
*H01L 23/538* (2006.01)
*H01L 23/00* (2006.01)

(52) U.S. Cl.
CPC ...... *H01L 23/5384* (2013.01); *H01L 23/5385* (2013.01); *H01L 24/16* (2013.01); *H01L 25/0655* (2013.01); *H01L 2224/16227* (2013.01); *H01L 2924/1431* (2013.01); *H01L 2924/1433* (2013.01); *H01L 2924/1434* (2013.01); *H01L 2924/157* (2013.01); *H01L 2924/15192* (2013.01); *H01L 2924/15311* (2013.01); *H01L 2924/15313* (2013.01); *H01L 2924/3511* (2013.01)

(56) References Cited

U.S. PATENT DOCUMENTS

| | | | |
|---|---|---|---|
| 2010/0081232 A1 | 4/2010 | Furman | |
| 2011/0304999 A1* | 12/2011 | Yu | H01L 23/15 361/783 |
| 2012/0074584 A1* | 3/2012 | Lee | H01L 21/76898 257/774 |
| 2012/0098129 A1 | 4/2012 | Reed et al. | |
| 2012/0267777 A1* | 10/2012 | Haba | H01L 25/0652 257/737 |
| 2013/0119555 A1 | 5/2013 | Sundaram et al. | |
| 2014/0159228 A1* | 6/2014 | Teh | H01L 24/19 257/734 |
| 2014/0159248 A1* | 6/2014 | Mohammed | H01L 25/0652 257/774 |
| 2014/0239444 A1* | 8/2014 | Yee | H01L 21/486 257/532 |

OTHER PUBLICATIONS

"International Application Serial No. PCT/US2015/047811, Written Opinion dated May 30, 2016", 9 pgs.
"Taiwanese Application Serial No. 105121525, Office Action dated Dec. 2, 2019", W/ English Translation, 7 pgs.
"Taiwanese Application Serial No. 105121525, Response filed Feb. 5, 2020 to Office Action dated Dec. 2, 2019", w/ English claims, 49 pgs.

* cited by examiner

INORGANIC INTERPOSER FOR MULTI-CHIP PACKAGING

CROSS-REFERENCE TO RELATED APPLICATION

This application is a U.S. National Stage Filing under 35 U.S.C. 371 from International Application No. PCT/US2015/047811, filed on Aug. 31, 2015, which application is incorporated herein by reference in its entirety.

TECHNICAL FIELD

This disclosure relates generally to semiconductor packaging that includes multiple chips.

BACKGROUND ART

Semiconductor devices, such as electronic devices, can include substrate routing that is of a lower density than some of the routing in a chip that is attached to the substrate. Such devices can include complex routing schemes especially in areas in which the attached chip includes higher density routing than the routing in the substrate.

DESCRIPTION OF THE EMBODIMENTS

The following description and the drawings sufficiently illustrate specific embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

Multichip packaging in high density interconnect substrates has been addressed by many proposed solutions using 2.5D and 3D architectures, each of which possess their own merits and drawbacks in terms of both cost and technical capability. One such multi-chip package (MCP) builds an organic interposer directly on top of the buildup layers of a substrate package.

In embodiments discussed herein, an ultra-fine line space (e.g., less than two micrometers) routing required for high density, low speed signal routing between multiple dies on a package is accomplished through an inorganic material stack (e.g., an inorganic interposer). High speed signal transfer and power delivery are routed through standard buildup layers. This is at least in part because those high speed signal and power delivery typically requires a larger effective trace cross sectional area. This hybrid structure is one of the advantages over a silicon interposer. A silicon interposer typically requires an additional package for the high speed signal and power delivery as shown FIG. 1. This is at least in part because trace thickness and width is smaller (e.g., less than two micrometers) in the silicon interposer.

Also, organic films that are typically used can suffer from process and mechanical limitations. Generally, the organic photo-imagable materials that are used in a transition layer have poor resolution capabilities, and the thin films require liquid coating, a process that is not ideal for large panels. Additionally, the organic materials used for these layers generally have high coefficient of thermal expansion (CTE) (e.g., less than forty parts per million per degree Celsius (ppm/C)) which can create warpage issues unacceptable for assembly and limit the number of stacked vias, which can be critical for enabling smaller package form factor. While much more cost effective than glass and silicon solutions, organic films have technical limitations that will likely make them impractical for high density multichip packaging applications.

Figure 1:
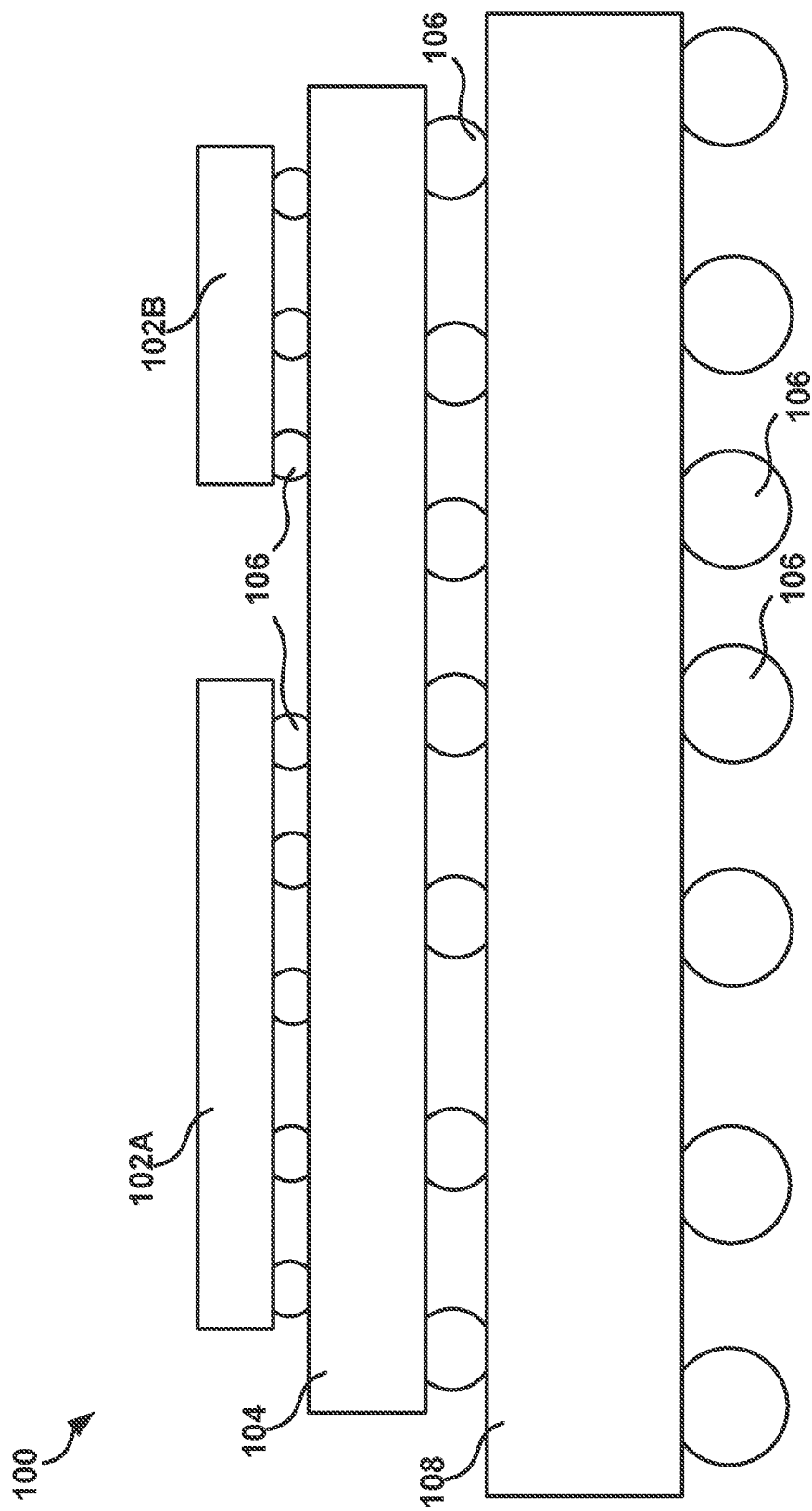
FIG. 1 illustrates a multi-chip package including a silicon interposer.

FIG. 1 illustrates a multi-chip package 100 including a silicon interposer 104. The package 100 as illustrated includes a first chip 102A and a second chip 102B electrically connected to each other through a silicon interposer 104. The first chip 102A can be electrically coupled to the second chip 102B through solder balls 106 electrically connected to interconnect circuitry of the silicon interposer 104 and the first and second chips 102A-B. The package 100 includes a second interposer 108 to accommodate the higher density routing of the silicon interposer 104 and the higher speed interconnection circuitry required.

Instead of using a silicon interposer or an interposer made of organic materials, a multi-chip package can include backend metallization similar to that of silicon semiconductor manufacturing to create an inorganic interposer. The same dual damascene process that is used to extend signal transmission from transistor to die bump from a scale of tens of nanometers to nearly a micron can be extended into the substrate package using equipment that is used in substrate manufacturing (e.g., sputter, plasma enhanced chemical vapor deposition (PECVD), dry etch, and/or chemical-mechanical planarization (CMP)). Silicon oxide and silicon nitride can be deposited using PECVD. These dielectrics can replace the organic films currently being used to create the interposer for multi-chip packages. The dielectrics can be patterned by a number of different processes. One such process can include a standard via-first dual damascene process. Silicon nitride can act as an etch stop layer, and several options are possible for a sputtered seed and barrier. Other possible processes can include a reduced number of steps and no need for silicon nitride. For example, the inorganic interposer can be created using a semi-additive or subtractive process. Such flows may sacrifice some layer-to-layer alignment and may not provide electrical features as fine as the damascene process, but can offer lower cost solutions. Additionally, using a subtractive or semi-additive process can eliminate the need for a silicon nitride etch stop layer, reduce parasitic capacitance, and/or improve signaling bandwidth and power efficiency.

Silicon oxide deposited using PECVD outperforms traditional organic dielectrics in terms of one or more electrical or mechanical properties. Silicon oxide deposited using PECVD includes a signal loss factor of about 0.0015, which is about five times lower than the best organic dielectrics and more than an order of magnitude lower than current organic films being used in multi-chip packaging. The less than one parts per million per degree Celsius CTE of the inorganic materials helps reduce overall package warpage.

Figure 2:
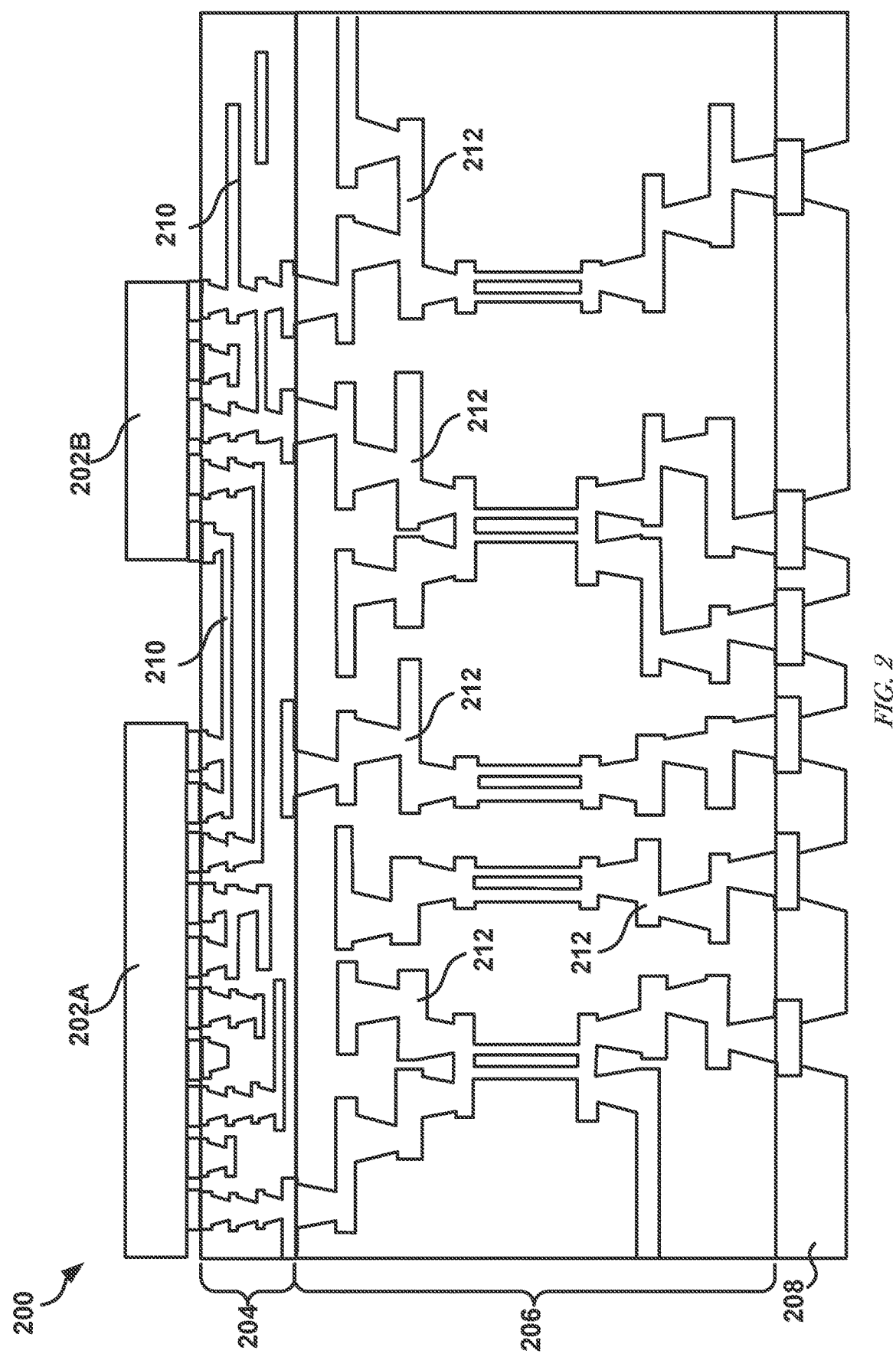
FIG. 2 illustrates, by way of example, a cross-section diagram of an embodiment of a multi-chip package including an inorganic interposer.

FIG. 2 illustrates, by way of example, a cross-section diagram of an embodiment of a multi-chip package 200 including an inorganic interposer 204. The package 200 as illustrated includes two dies 202A-B (e.g., semiconductor chips, such as can include a memory, logic die, radio, digital circuitry, analog circuitry, or the like), electrically connected to each other through high density electrical interconnect circuitry 210 in the interposer 204. The dies 202A-B are respectively, electrically connected to low density interconnect circuitry 212 in a core and buildup layer substrate 206 through high density interconnect circuitry 210 in the interposer 204. The interposer 204 includes high density interconnect circuitry 210 that is electrically connected to low density interconnect circuitry 212. Some of the high density interconnect circuitry 210 is electrically connected to the die 202A at a first end of the high density interconnect circuitry 210 and to the die 202B on the other end of the interconnect circuitry 210. A solder resist layer 208 is situated on the substrate 206 so as to facilitate an electrical connection to a circuit board, such as a printed circuit board (PCB), a flexible circuit board, or other circuit board.

The substrate 206 can be made using a variety of processes including a subtractive process or a semi-additive process. The interposer can be made using a variety of processes including a subtractive process, a semi-additive process, and a dual damascene process. These processes are described in FIGS. 4A-4S, FIGS. 5A-5M, and FIGS. 6A-6U, respectively.

Devices with inorganic interposers can have better signaling performance than other device architectures because, at least in part, the device with the inorganic interposer avoids the metal density and via density requirements of a typical silicon wafer process. Taking the HBM (high bandwidth memory) application as an example, the line pitch of the dense interconnects generally needs to be less than seven microns to route all the signals in two routing layers. Due to the via density requirements, a silicon interposer solution requires additional ground traces. For every two signal traces, there is generally one ground trace in the same layer. This is for the placement of vias to meet the via density requirement. Such a requirement tightens the line pitch to about 4.6 um. With the inorganic interposer there is no need for ground traces in the signal routing layer, so the line pitch can remain seven micrometers. The larger pitch allows better optimization of the design. In addition, the inorganic interposer has better resistance and capacitance characteristics than the silicon interposer. The silicon interposer can have about 7.1 Ohm/millimeter (mm) resistance and about 0.23 pico-farad (pF)/mm capacitance, while the inorganic interposer can include about 4.0 Ohm/mm resistance and about 0.20 pF/mm capacitance.

Figure 3:
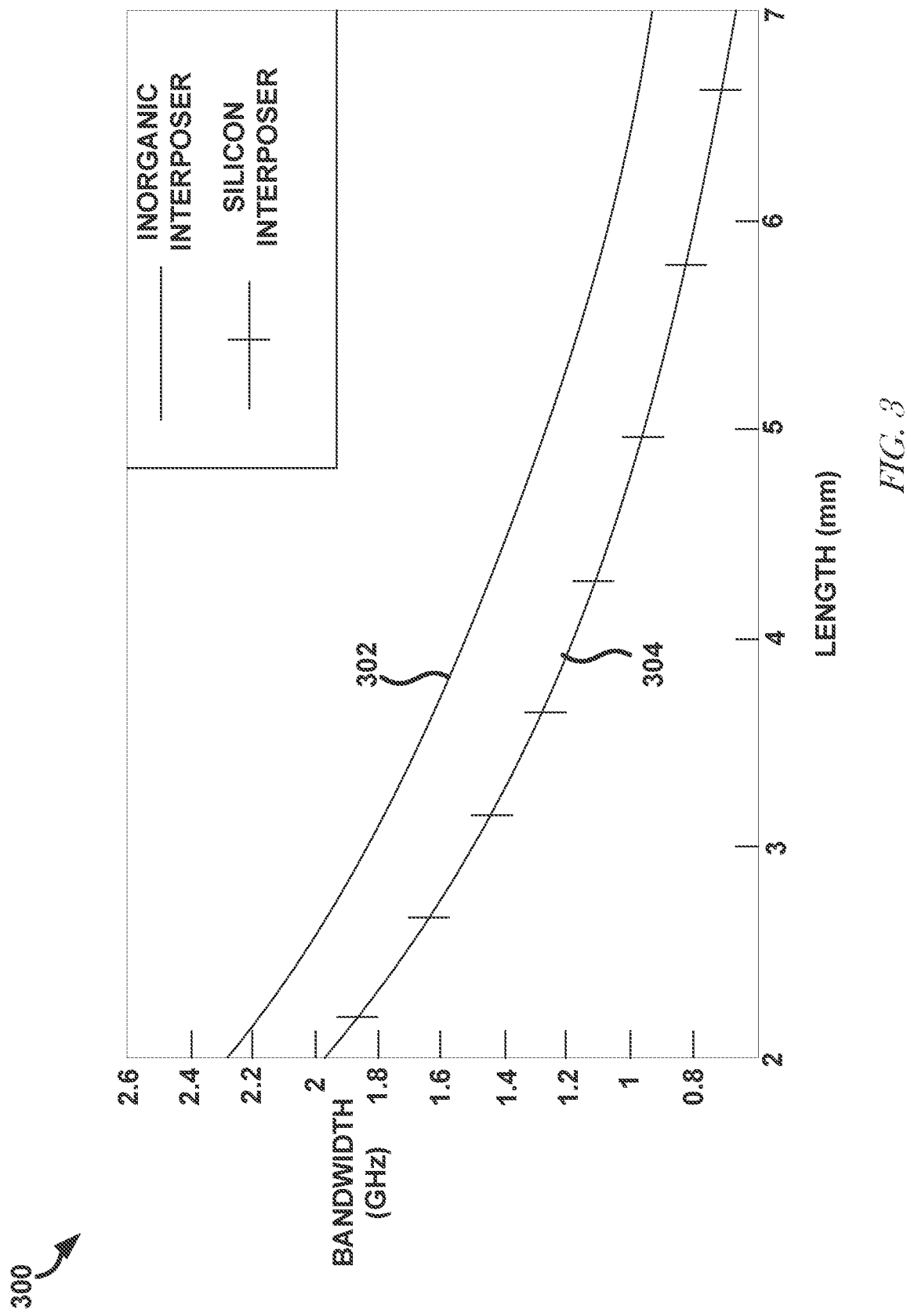
FIG. 3 illustrates, by way of example, a graph of bandwidth vs interconnect circuitry conductor length.

FIG. 3 illustrates, by way of example, a graph 300 of bandwidth vs interconnect circuitry conductor length for a device with a silicon interposer and an inorganic interposer, respectively. The line 302 represents a device with the inorganic interposer of the present disclosure and the line 304 represents a device with a silicon interposer. As is shown in the graph 300 three decibel loss bandwidth is improved. This increase in bandwidth corresponds to about a five percent unit intercal (UI) or about twenty-five picoseconds increase in eye width margin for a High Bandwidth Memory (HBM) interface, and about a ten percent reduction in power consumption. The signals passing through the inorganic interposer do not need to go through through-silicon-vias (TSVs) as it would be with a silicon interposer. This helps increase the performance gain of the inorganic interposer over the silicon interposer.

Figure 4A:
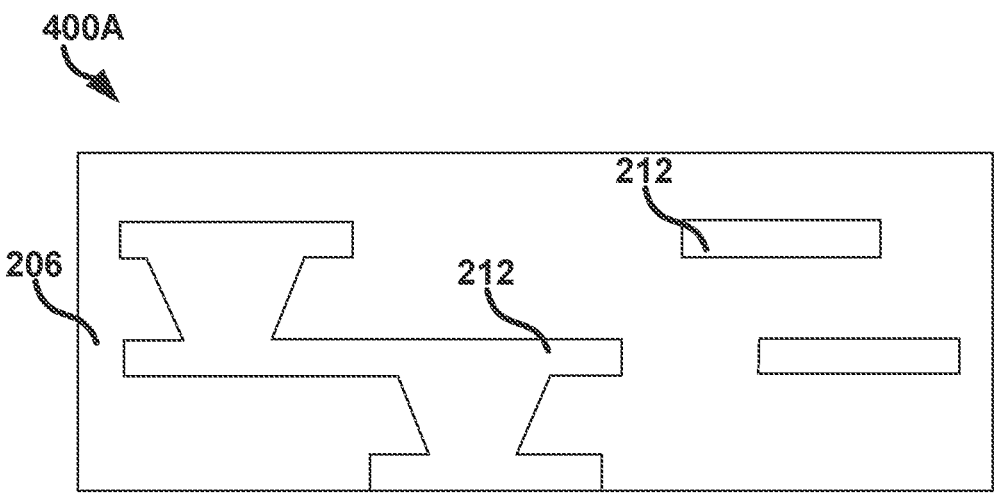
FIGS. 4A-4S illustrate, by way of example, cross-section diagrams that illustrate an embodiment of a method for creating interconnect circuitry in a substrate using a subtractive process.
Figure 4B:
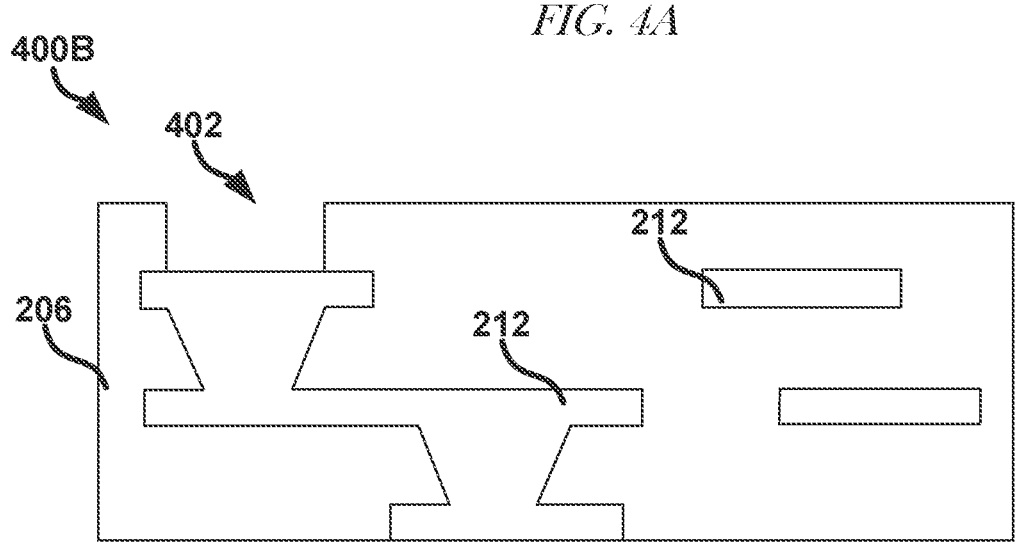
Figure 4C:
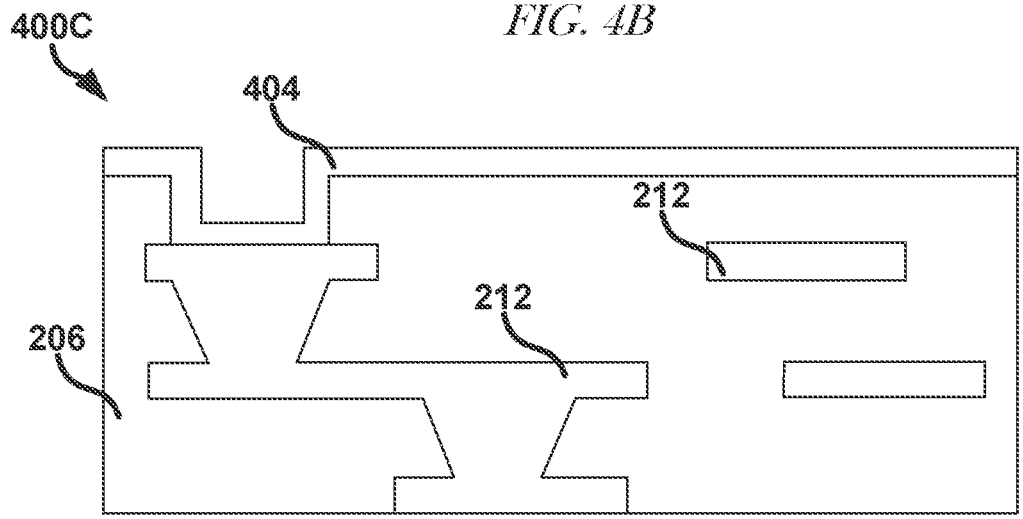
Figure 4D:
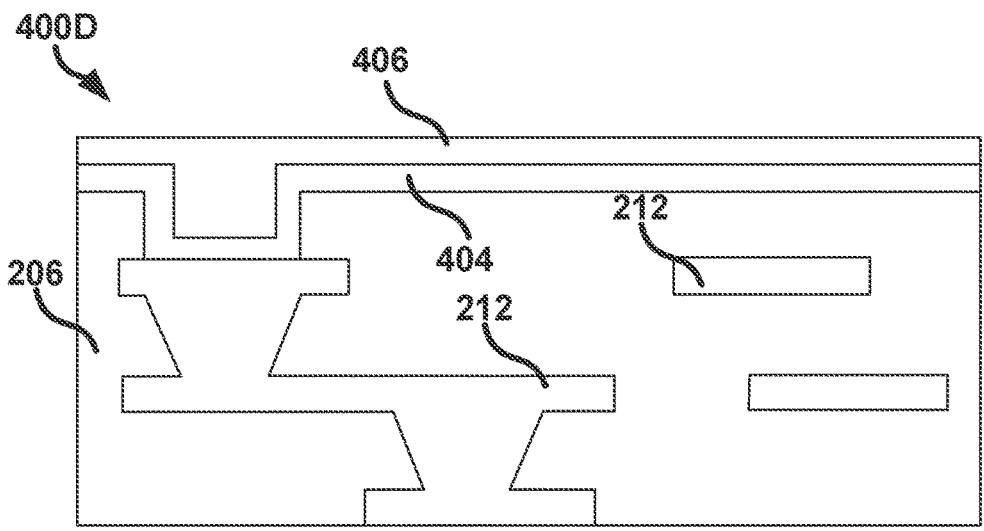
Figure 4E:
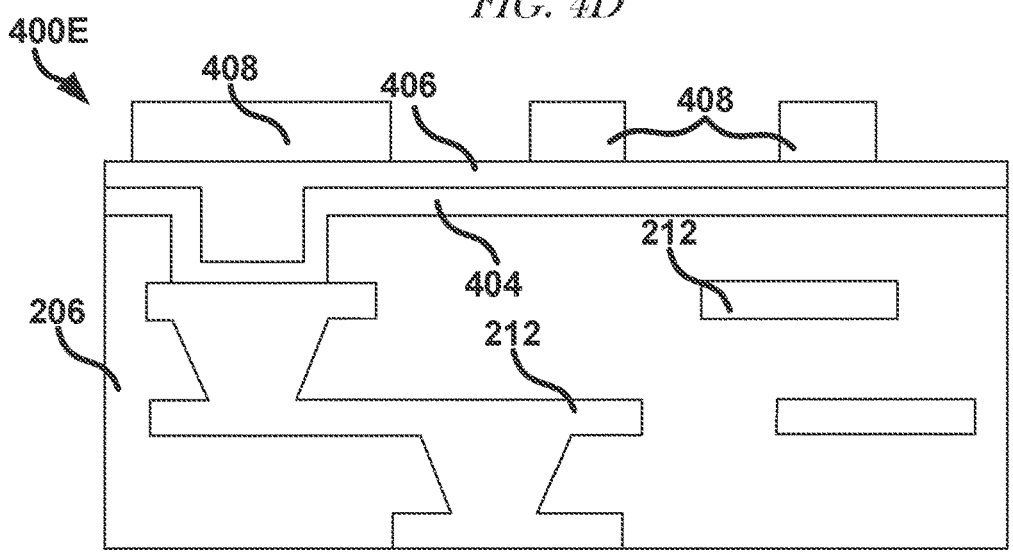
Figure 4F:
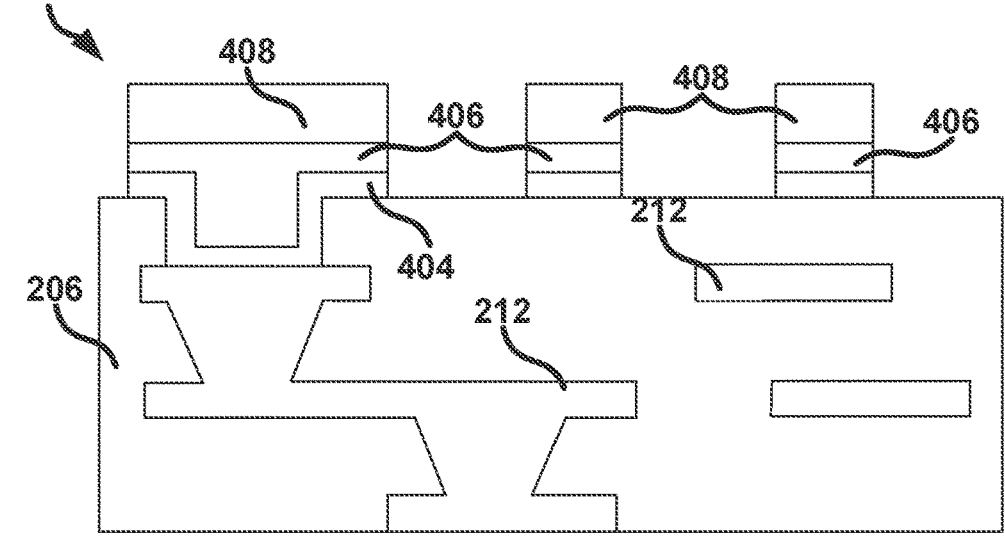
Figure 4G:
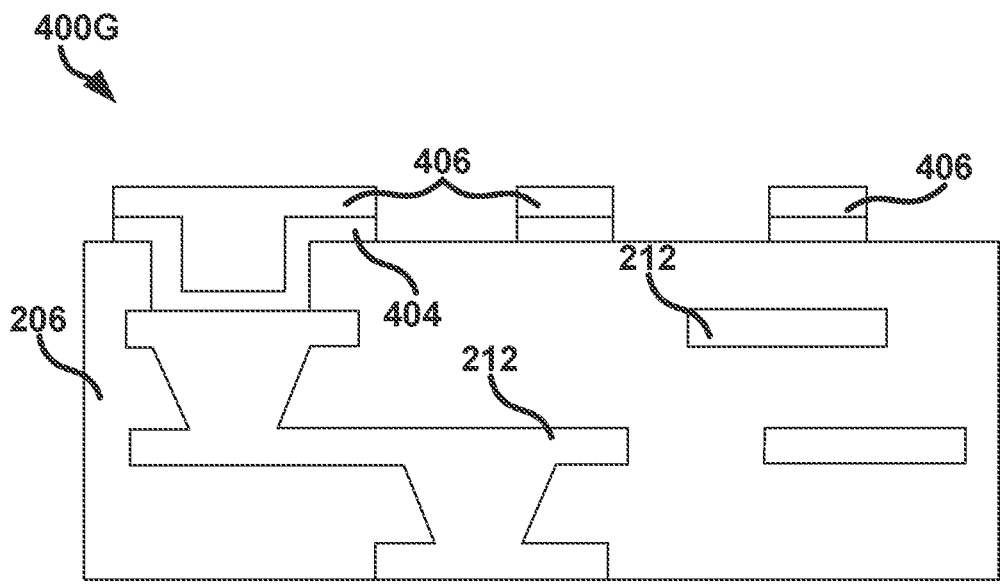
Figure 4H:
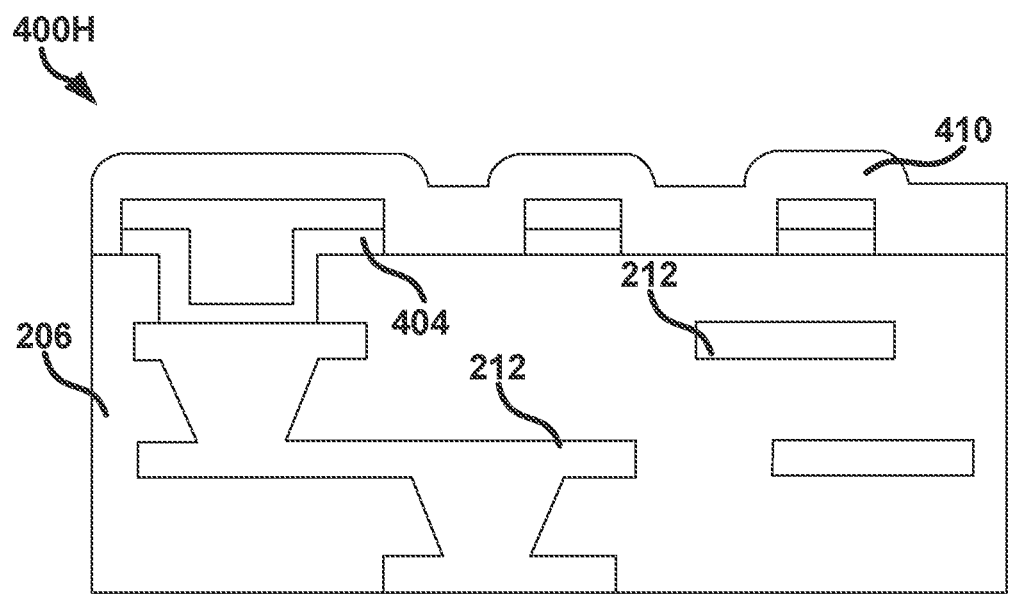
Figure 4I:
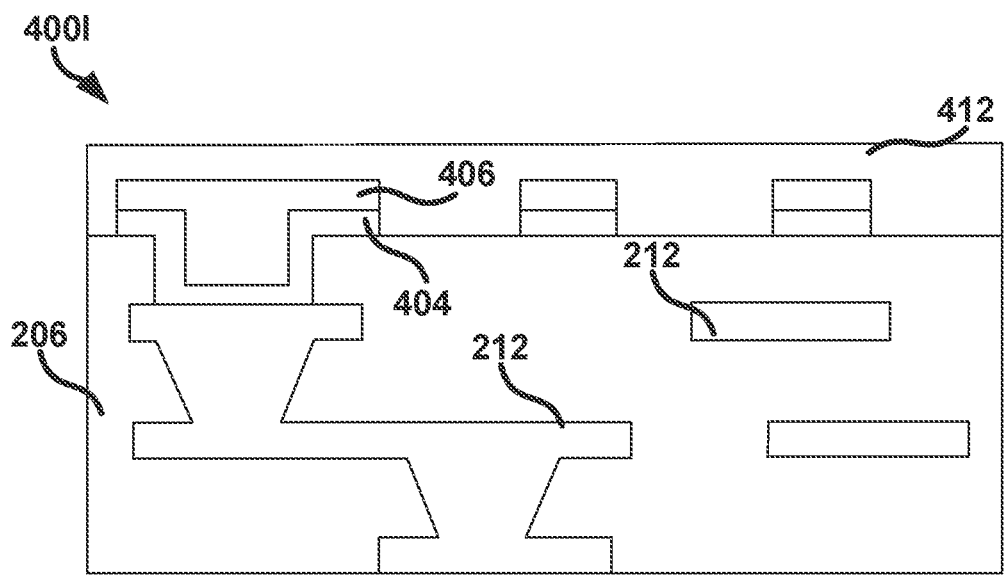
Figure 4J:
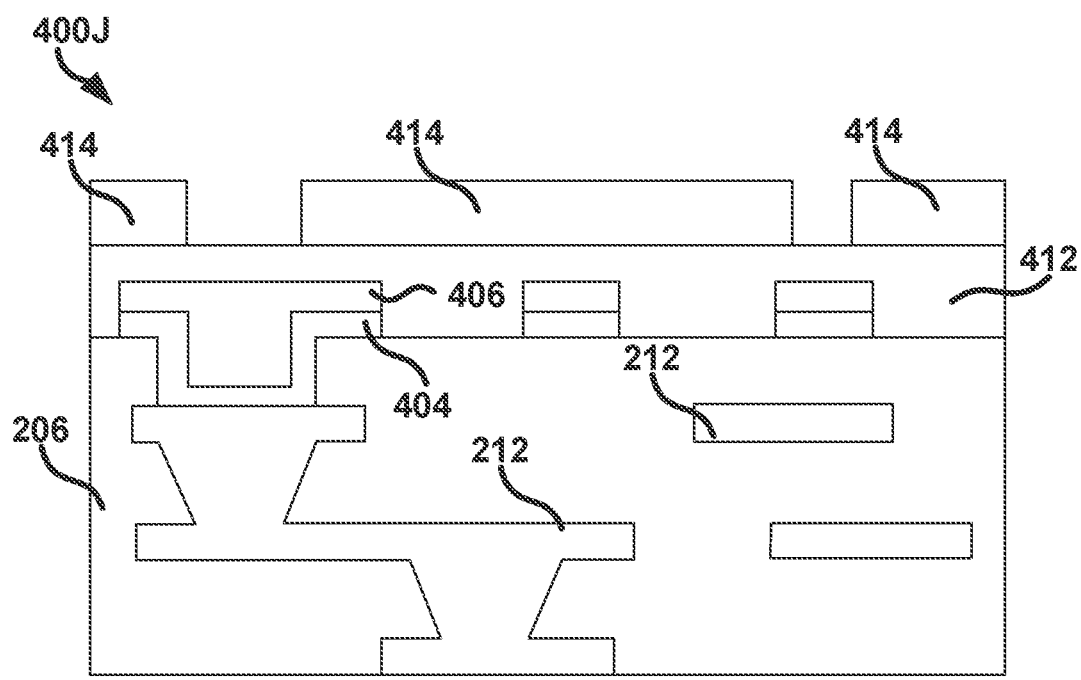
Figure 4K:
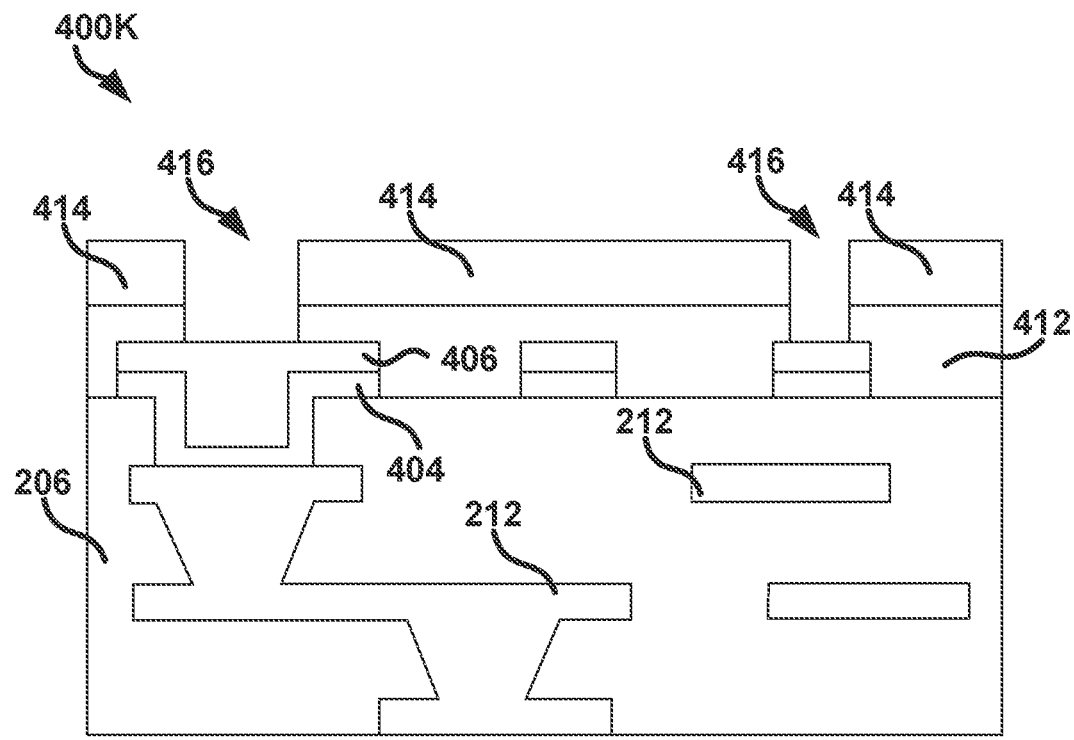
Figure 4L:
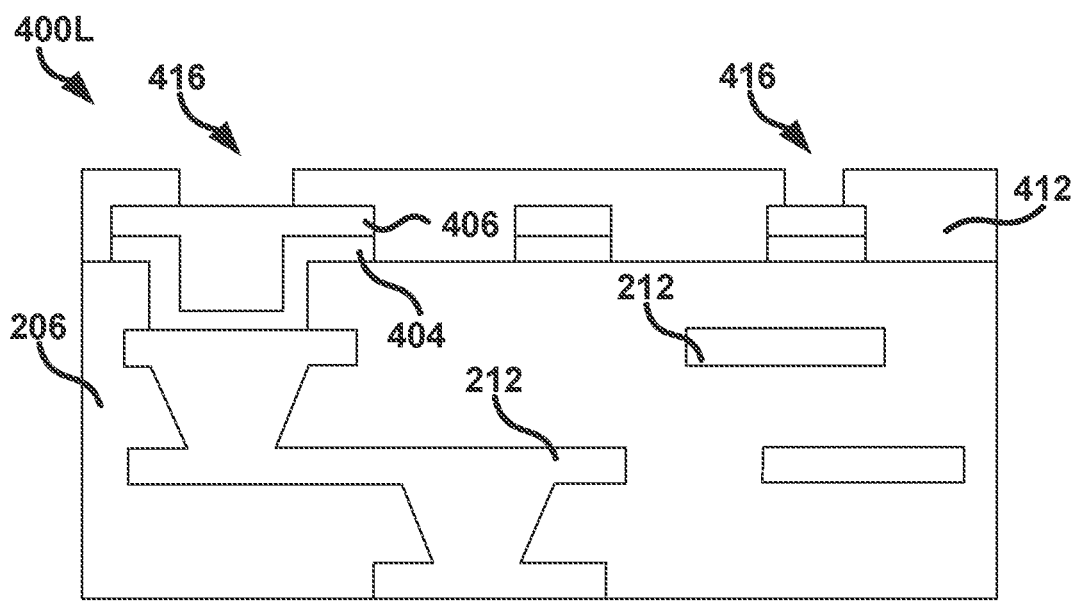
Figure 4M:
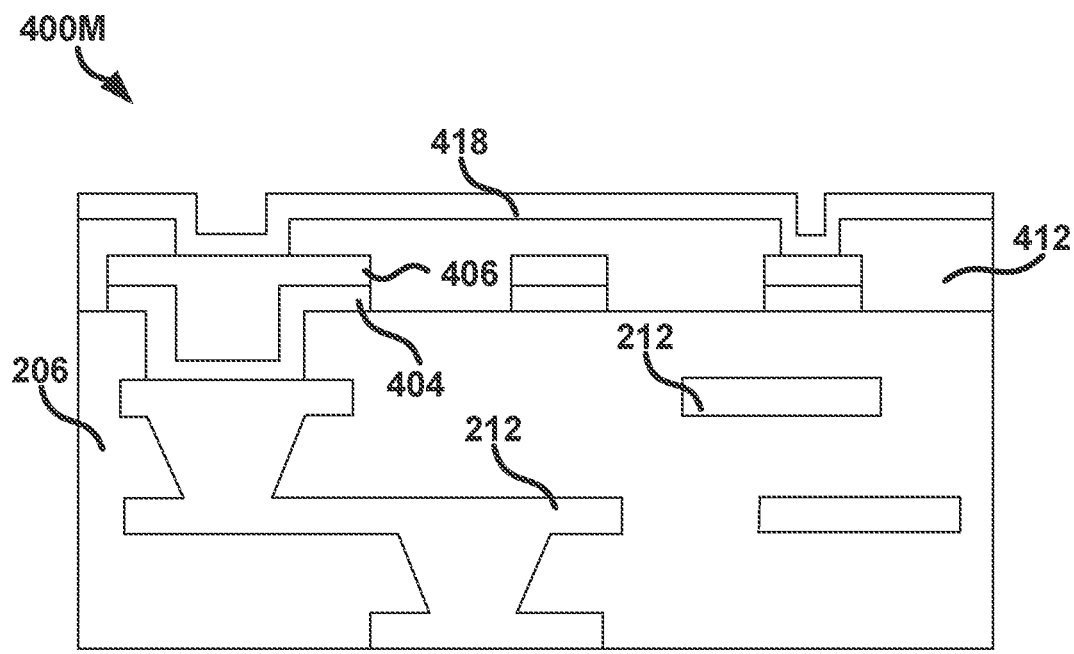
Figure 4N:
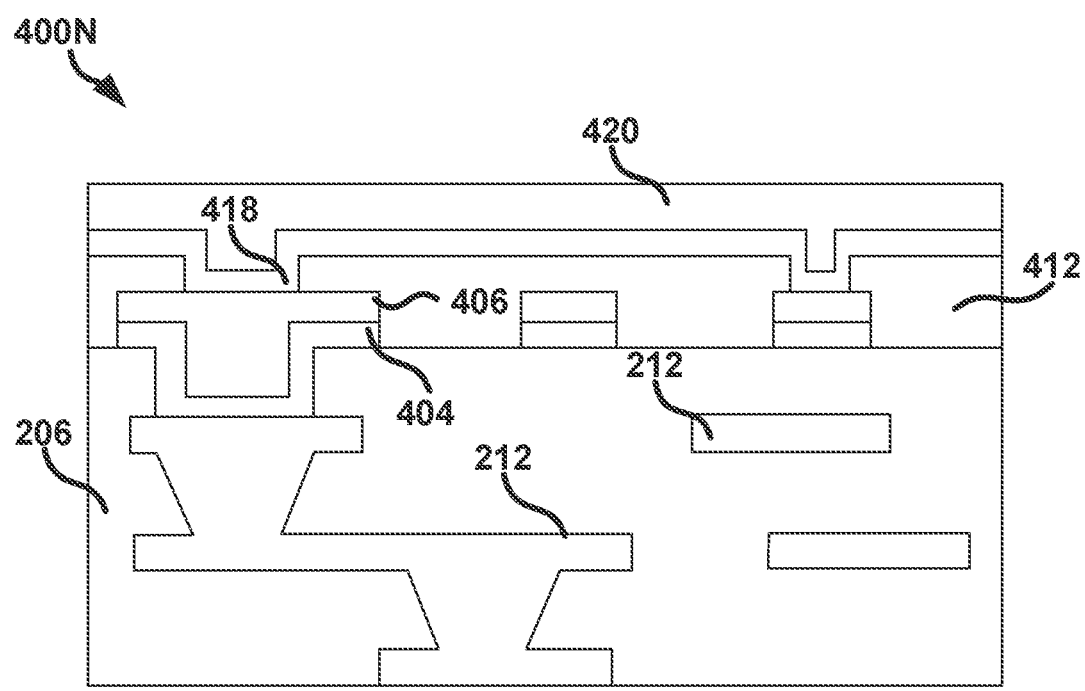
Figure 4O:
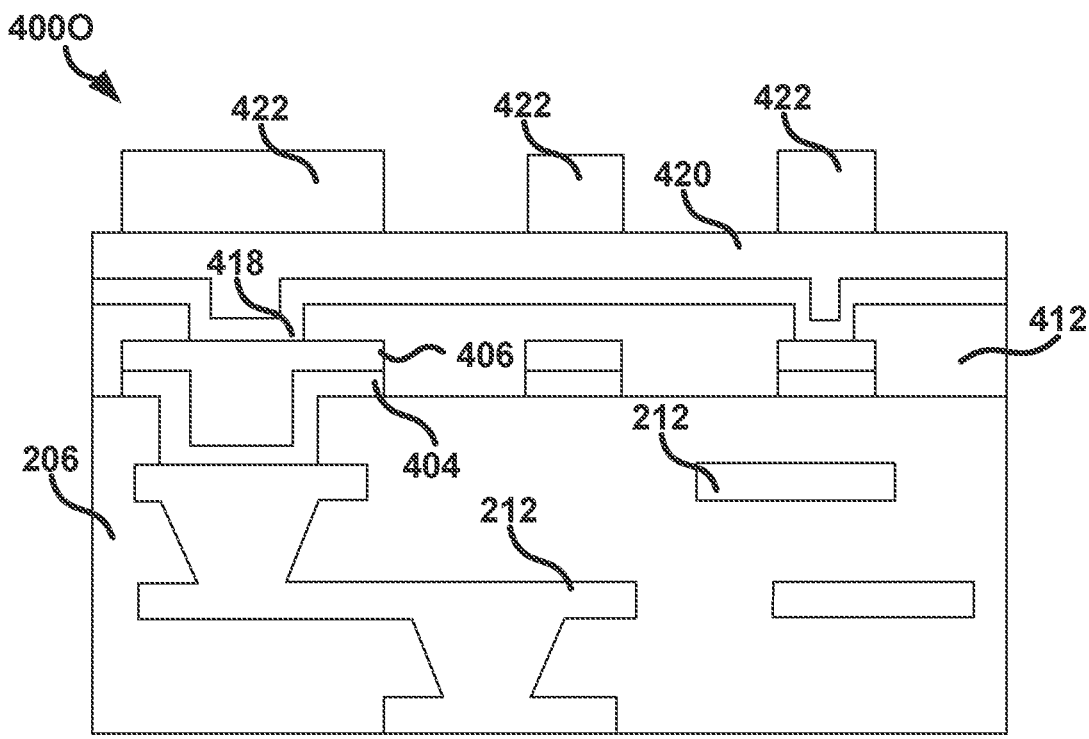
Figure 4P:
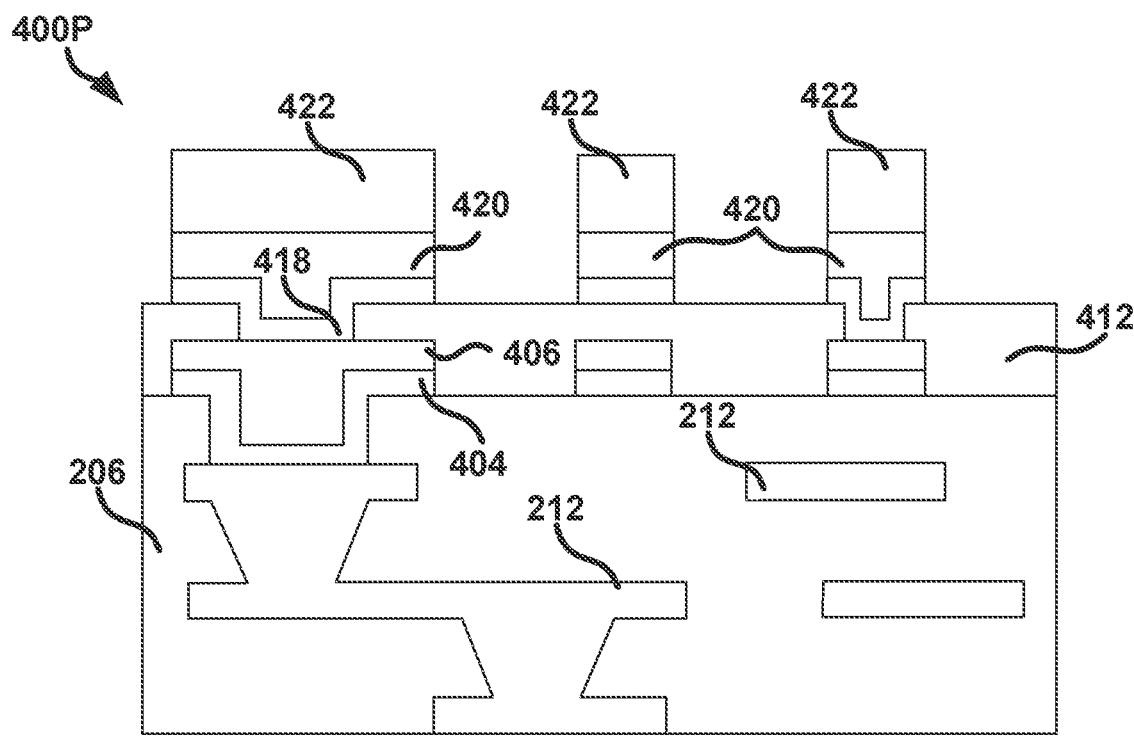
Figure 4Q:
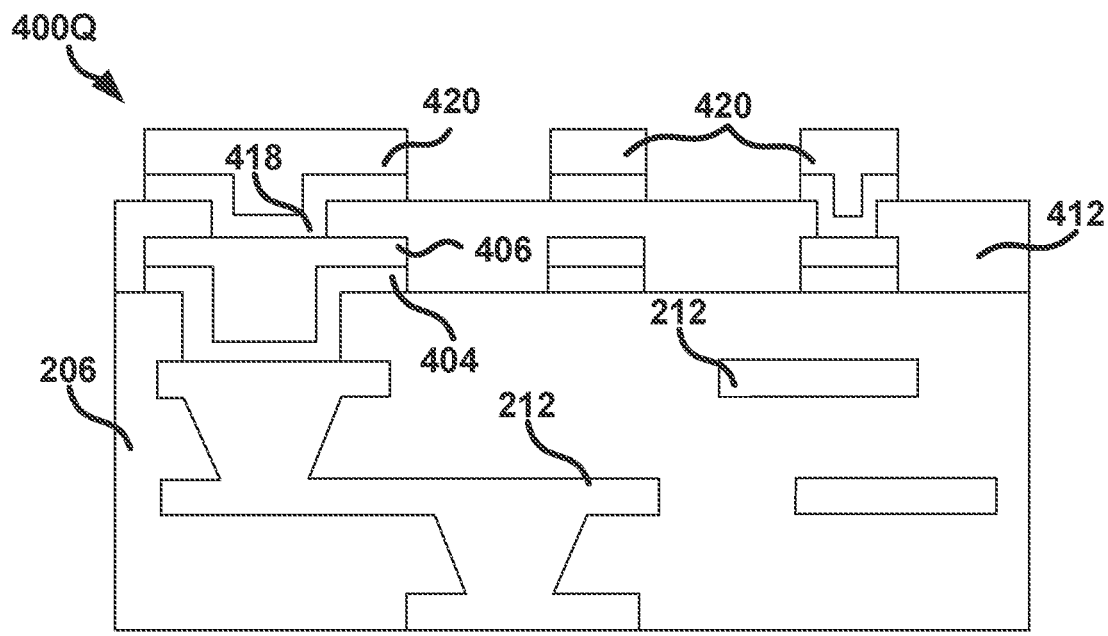
Figure 4R:
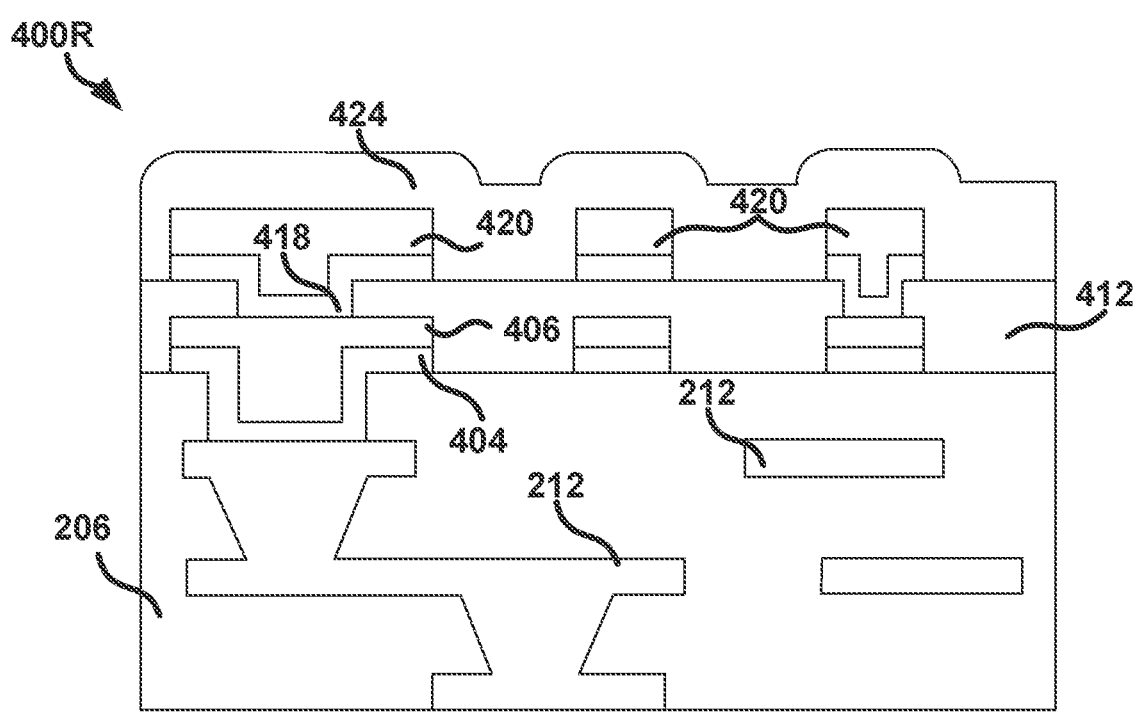
Figure 4S:
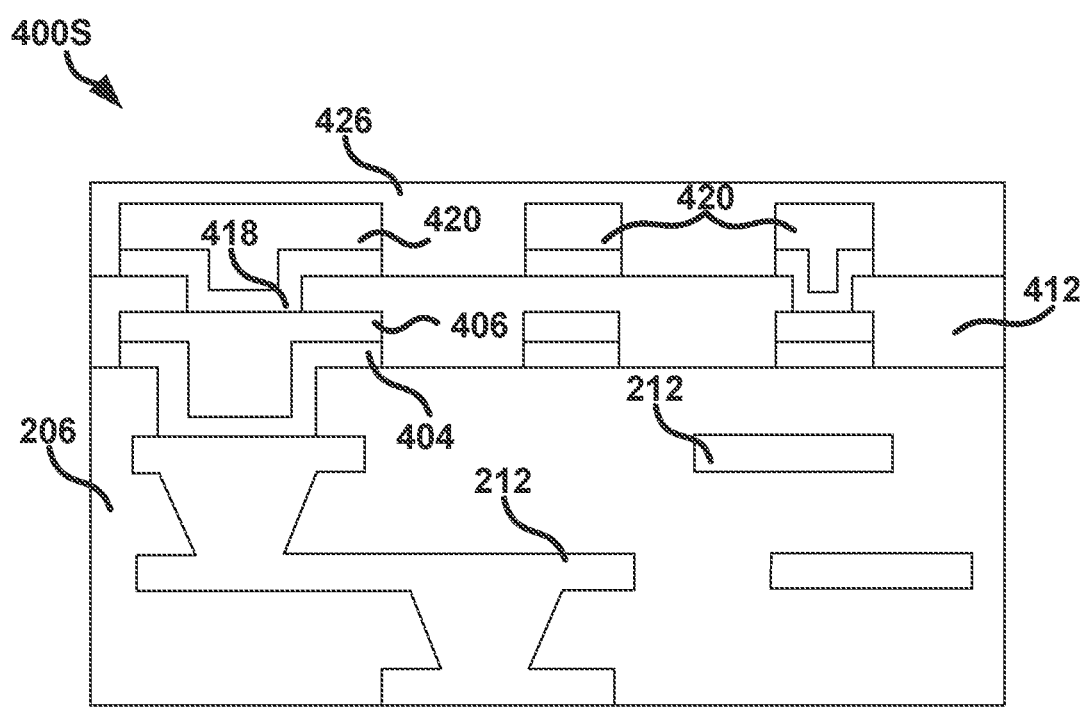

FIGS. 4A-4S illustrate, by way of example, cross-section diagrams that illustrate an embodiment of a process for creating an inorganic interposer on a substrate using a subtractive process. FIG. 4A shows a device 400A including a substrate 206 with low density interconnect circuitry 212 after a planarization and polishing has been performed to planarize the top layer of the substrate 206. A substrate 206 can be created, such as by using a semi-additive or subtractive process. FIG. 4B shows a device 400B that includes the device 400A after a laser drilling to form a via hole 402 in the substrate 206.

A conductive seed material 404 is sputtered on the device 400B to form the device 400C of FIG. 4C. The seed material 404 can include copper, gold, ruthenium, tantalum, tantalum nitride, a compound of those materials or other conductive material. A conductive material 406 is electrolytically plated on the seed material 404 to form the device 400D of FIG. 4D. The conductive material 404 can include the same or a different material as the seed material 404 or other electrical conductor. An etch resist material 408 is patterned on the conductive material 406 to form the device 400E of FIG. 4E. The etch resist material 408 can include any resist material that provides some etch selectivity to silicon oxide, such as 15NXT liquid negative photo resist type from AZ Electronic Materials of Luxembourg City, Luxemburg.

The device 400F of FIG. 4F includes the device 400E after etching the conductive material 406 and the seed material 404, such as to expose portions of the substrate 206 and/or electrically isolate conductive material. The resist material 408 of the device 400F is stripped to form the device 400G of FIG. 4G.

A silicon oxide 410 is deposited on the device 400G to form the device 400H of FIG. 4H. The deposited silicon oxide 410 is planarized to form a planarized silicon oxide 412 over the substrate 206 and the conductive material 406, as shown in device 400I of FIG. 4I. FIG. 4J shows a device 400J that includes the device 400I with an etch resist material 414 patterned on the planarized silicon oxide 412. FIG. 4K shows the device 400J after a plasma etching process (e.g., a reactive ion etching process) to form via holes 416 in the planarized silicon oxide 412 to form the device 400K. At least a portion of the conductive material 406 is exposed by the plasma etching process.

The device 400L of FIG. 4L includes the device 400K with the etch resist material 414 stripped therefrom, such as to expose the planarized silicon oxide 412. FIG. 4M shows the device 400L with another conductive seed material 418 sputtered on the planarized silicon oxide 412 and the conductive material 406 to from the device 400M. Another conductive material 420 is electrolytically plated on the seed material 418 of the device 400M to form the device 400N, as shown in FIG. 4N.

FIG. 4O shows the device 400N with an etch resist material 422 patterned on the conductive material 420 to form the device 400O. FIG. 4P shows the device 400P, which includes the device 400O after a subtractive etch process is performed to expose portions of the planarized silicon oxide 412. The device 400Q of FIG. 4Q shows the device 400P with the etch resist material 422 stripped therefrom, such as to expose the conductive material 420.

FIG. 4R shows the device 400Q with a silicon oxide 424 deposited on the planarized silicon oxide 412 and the conductive material 420 to form the device 400R. The device 400S of FIG. 4S includes the device 400R after the silicon oxide 424 is planarized to form a planarized silicon oxide 426. The inorganic interposer layers can continue to be built up and followed by the operations described with regard to FIG. 6U, such as to form the device 200 of FIG. 2.

Figure 5A:
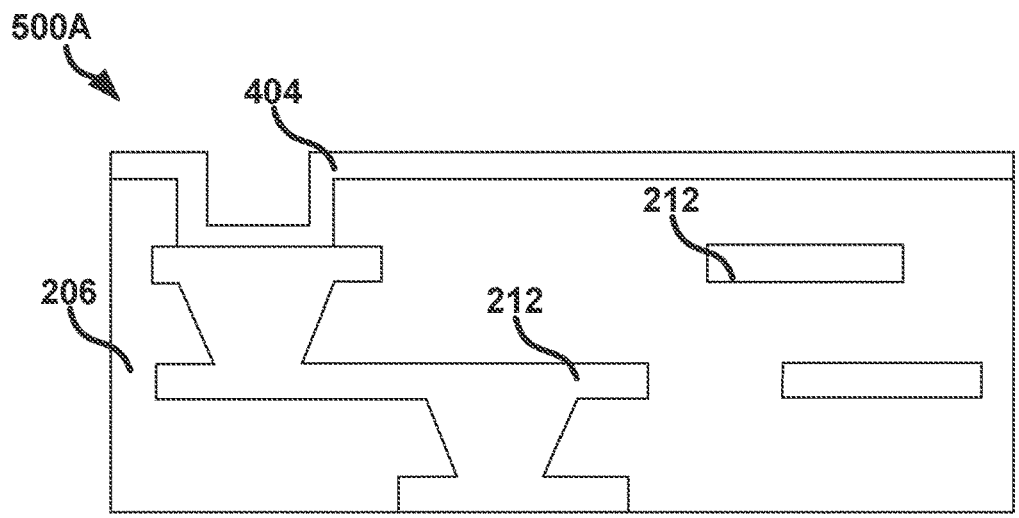
FIGS. 5A-5M illustrate, by way of example, cross-section diagrams of an embodiment of a method for creating interconnect circuitry in a substrate using a semi-additive process.
Figure 5B:
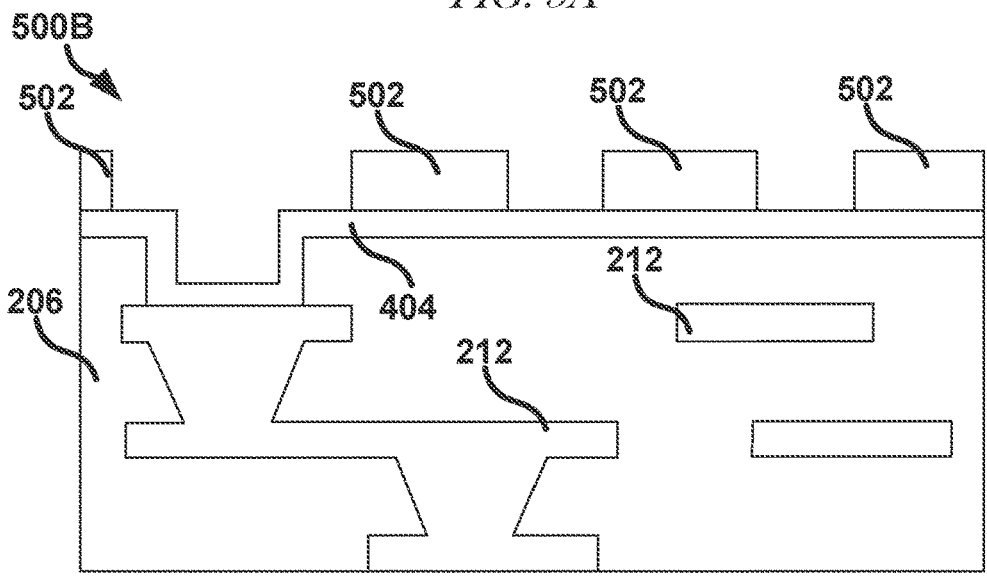
Figure 5C:
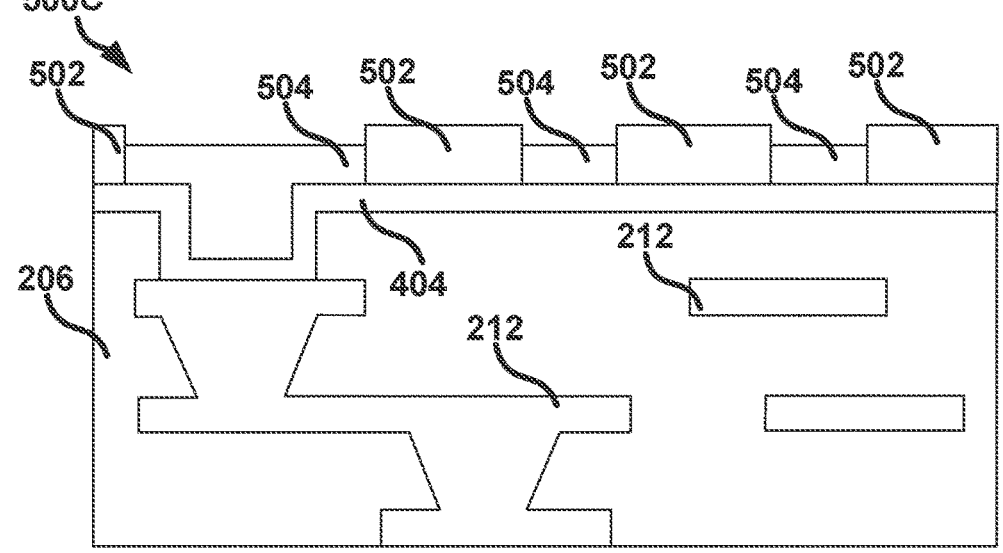

FIGS. 5A-5M illustrate, by way of example, cross-section diagrams of an embodiment of a method for creating an inorganic interposer on a substrate using a semi-additive process. FIG. 5A illustrates a device 500A that is the same as the device 400C of FIG. 4C. The device 500B of FIG. 5B includes the device 500A with an pattern plating resist material 502 patterned thereon. The pattern plating resist material can include the same material as the etch resist material 422. The device 500B is electrolytically plated with conductive material 504 to form the device 500C of FIG. 5C. The conductive material 504 is plated on portions of the seed material 404 exposed by the pattern plating resist material 502.

Figure 5D:
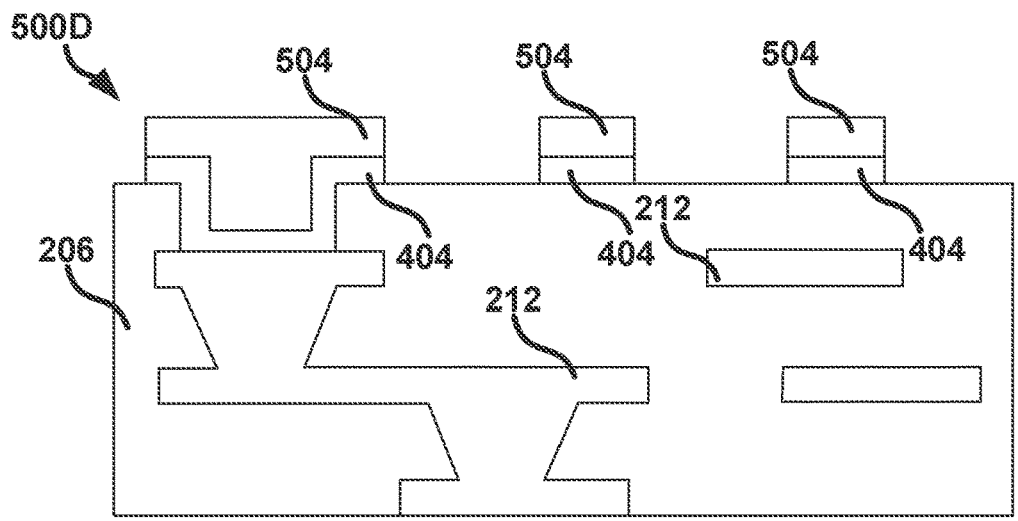
Figure 5E:
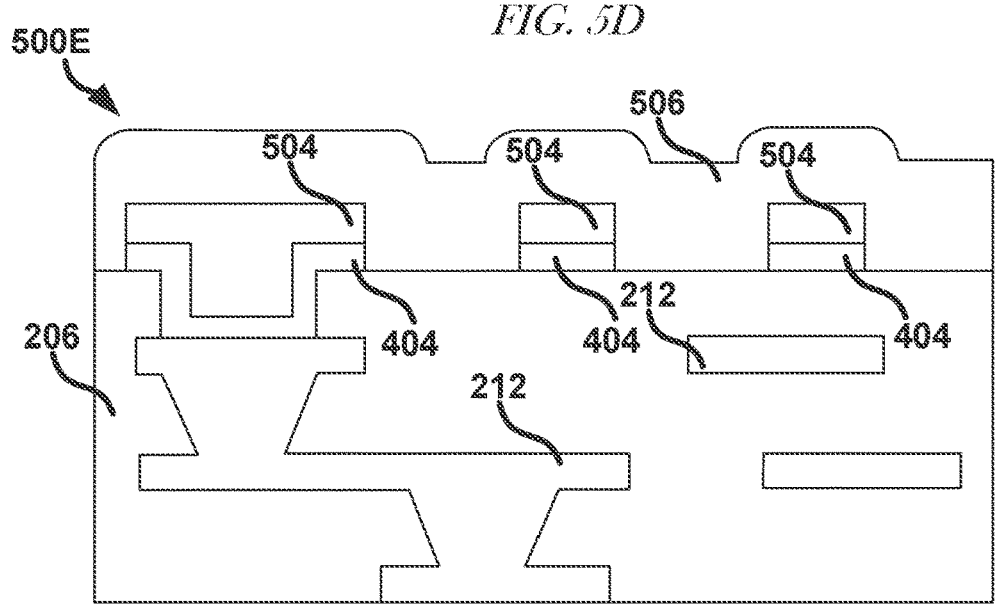
Figure 5F:
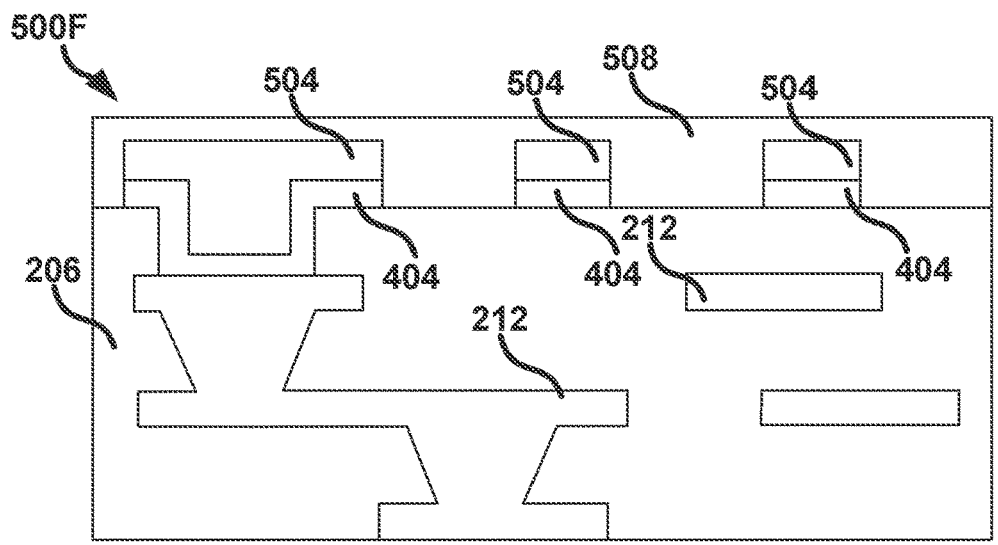

FIG. 5D shows a device 500D that includes the device 500C with the pattern plating resist material 502 stripped therefrom and the seed material 404 flash etched, such as to expose portions of the substrate 206 and electrically isolate the conductive material 504. A flash etch is a quick etch that is sufficient to remove seed material but insufficient to remove the conductive material plated on the seed material. The device 500E of FIG. 5E shows the device 500D after silicon oxide 506 is deposited on exposed portions of the substrate 206 and the conductive material 504. The silicon oxide 506 of the device 500E is planarized, such as to form planarized silicon oxide 508 on the substrate 206 and the conductive material 504 and to form the device 500F shown in FIG. 5F. Planarizing can include using a chemical mechanical polish (CMP). Such a polish can include using a polishing pad and a slurry, such as can be helpful for abrasion and dissolution of residue).

Figure 5G:
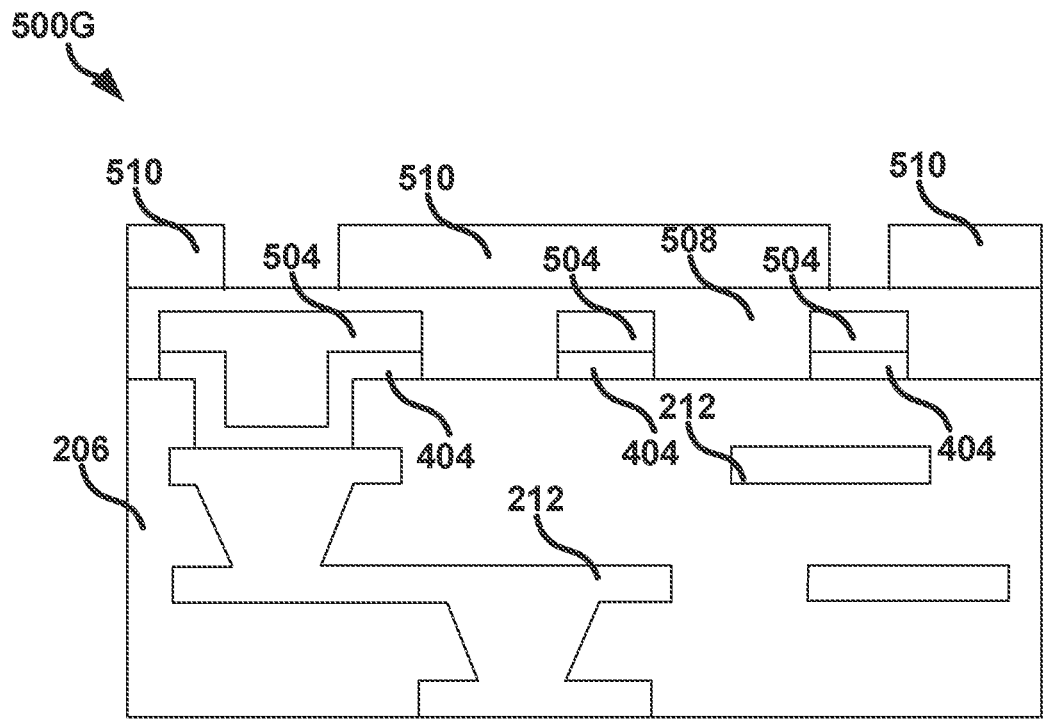
Figure 5H:
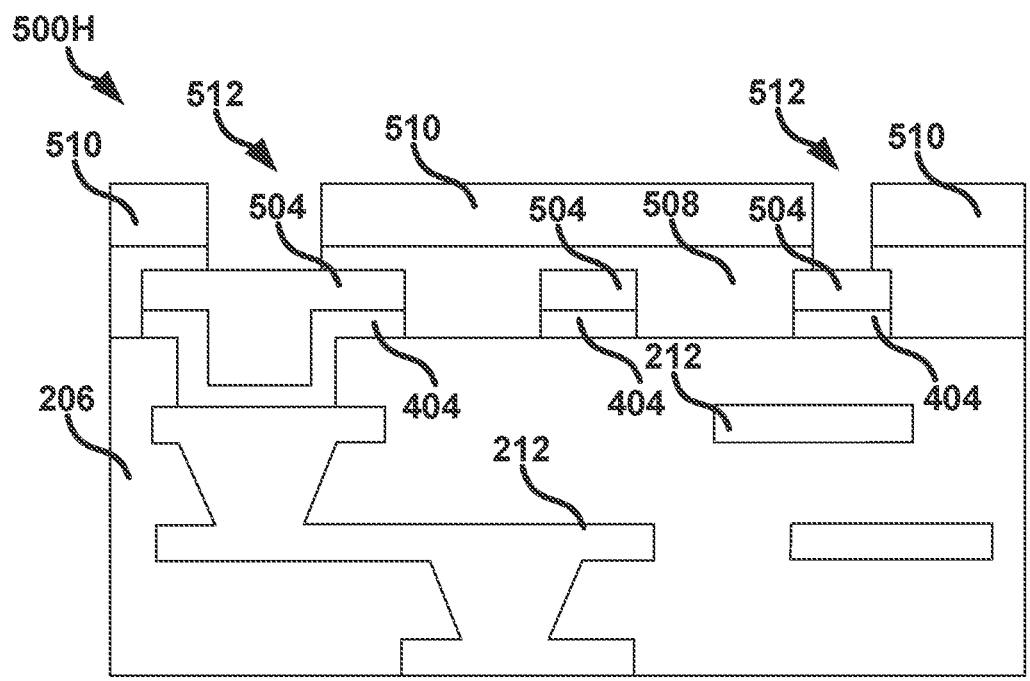
Figure 5I:
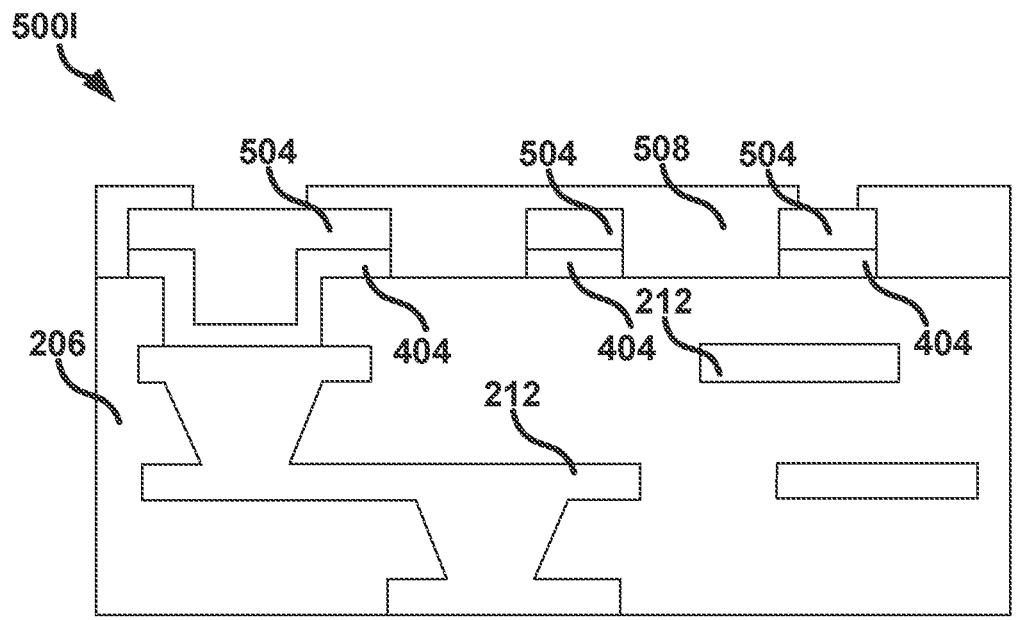
Figure 5J:
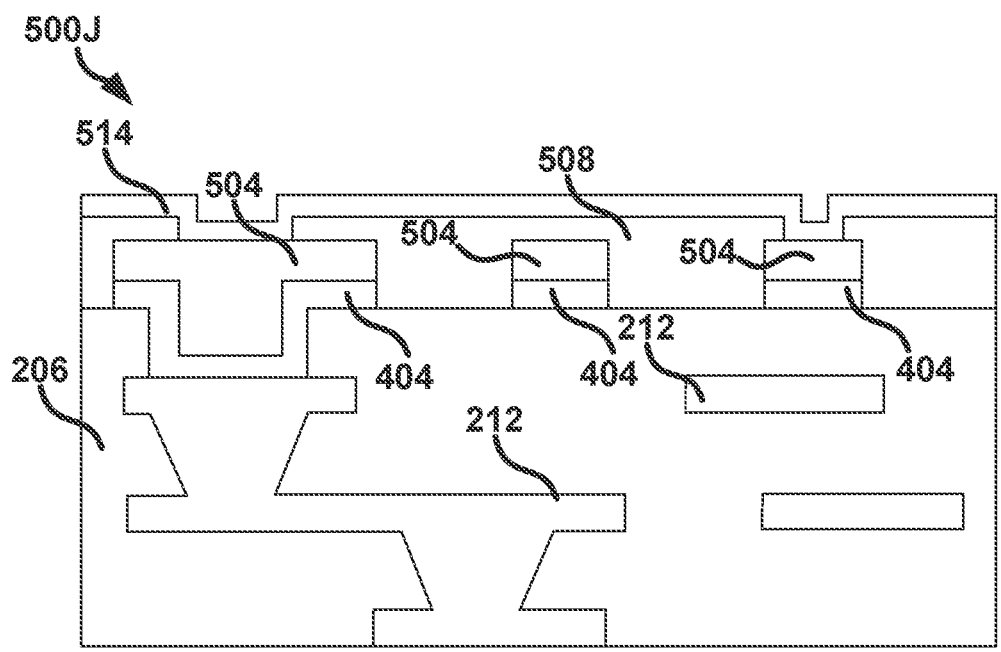

The device 500G of FIG. 5G includes the device 500F with an etch resist material 510 patterned thereon. FIG. 5H shows a device 500H that includes the device 500G after a plasma etch process removes exposed portions of the planarized silicon oxide 508 to form via holes 512. The etch process exposes portions of the conductive material 504. The etch resist material 510 is stripped to form the device 500I of FIG. 5I. FIG. 5J shows a device 500J that includes the device 500I with a seed material 514 sputtered on the planarized silicon oxide 508 and exposed portions of the conductive material 504.

Figure 5K:
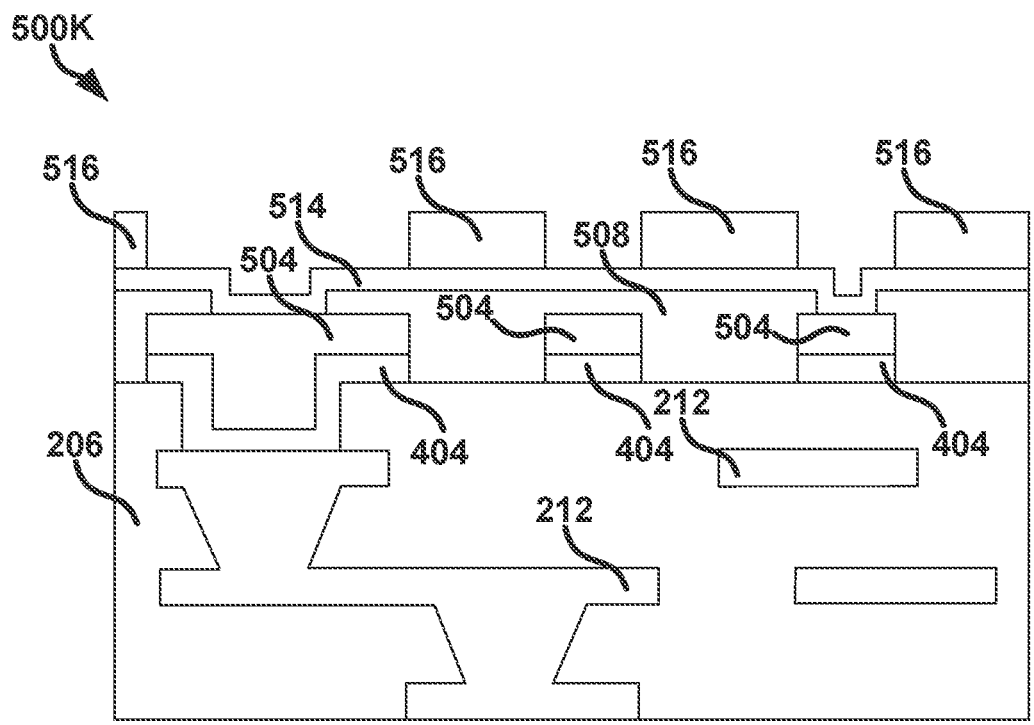
Figure 5L:
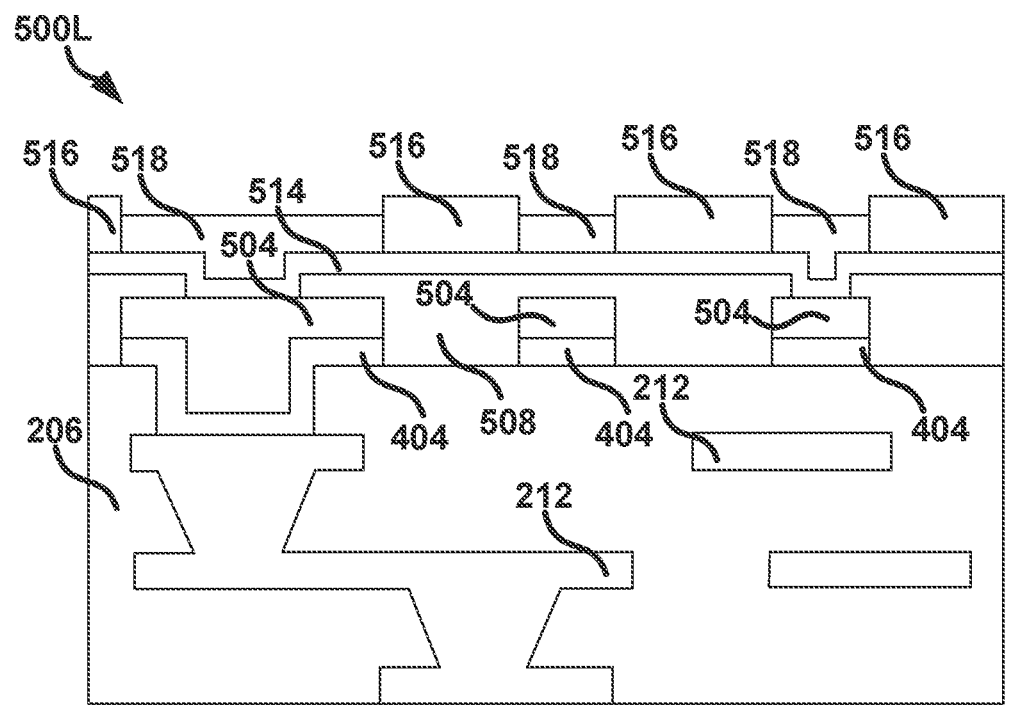
Figure 5M:
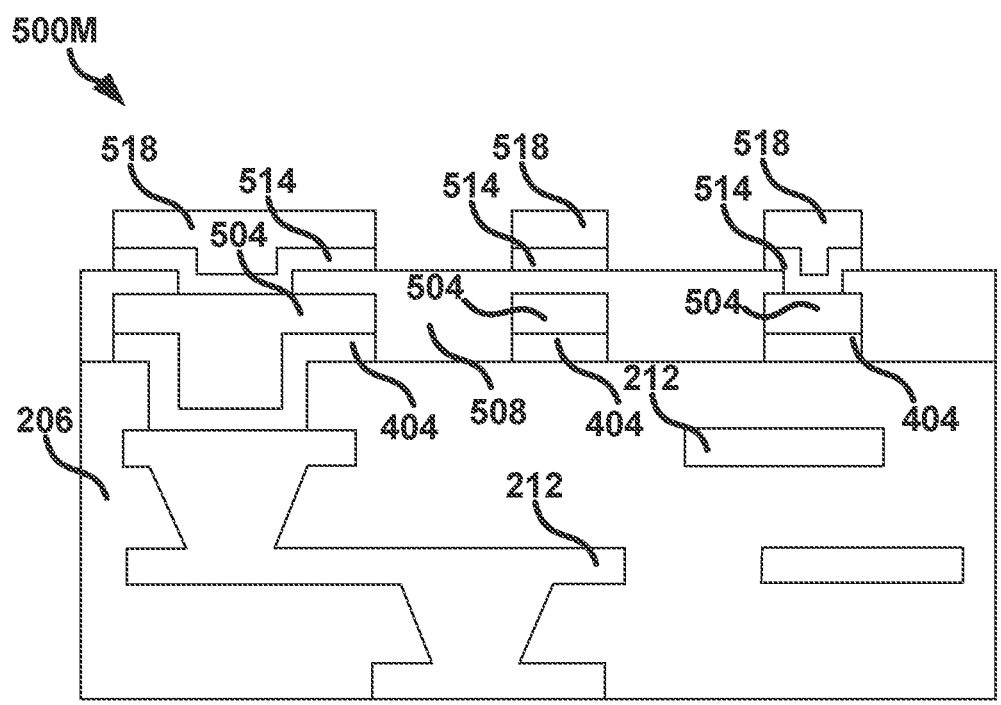

A pattern plating resist material 516 is patterned on the device 500J to form the device 500K of FIG. 5K. The device 500K is electrolytically plated with conductive material 518 to form the device 500L of FIG. 5L. The device 500M includes the device 500L with the pattern plating resist material 516 stripped therefrom and portions of the seed material 514 removed therefrom using an etch process (e.g., a flash etch process). The etch process exposes portions of the planarized silicon oxide material 508 and electrically isolates conductive material 518. The device 500M can be processed, such as by using the processes described in FIGS. 5E and 5F followed by the process described with regard to FIG. 6U. The device can be further processed, such as to form the device 200 of FIG. 2.

Figure 6A:
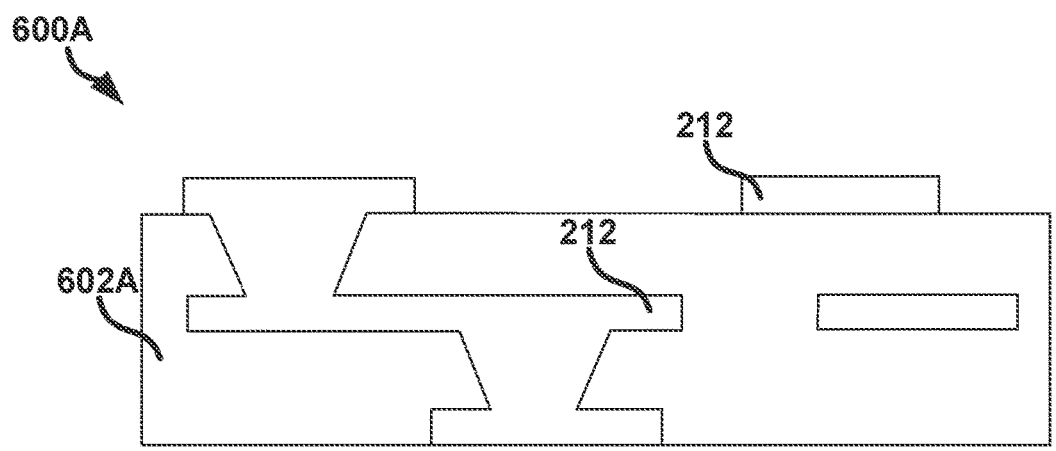
FIGS. 6A-6U illustrate, by way of example, cross-section diagrams of an embodiment of a method for creating an inorganic interposer on a substrate using a dual damascene process.
Figure 6B:
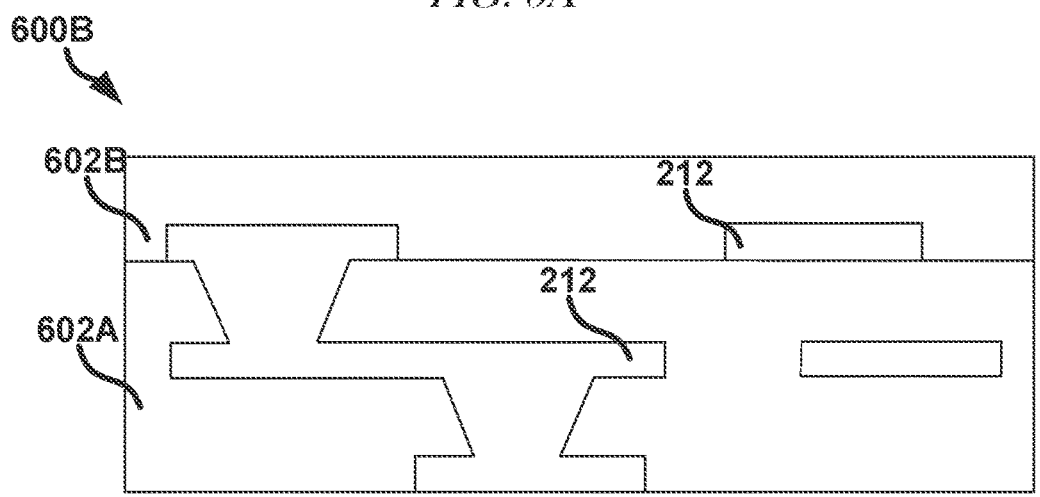
Figure 6C:
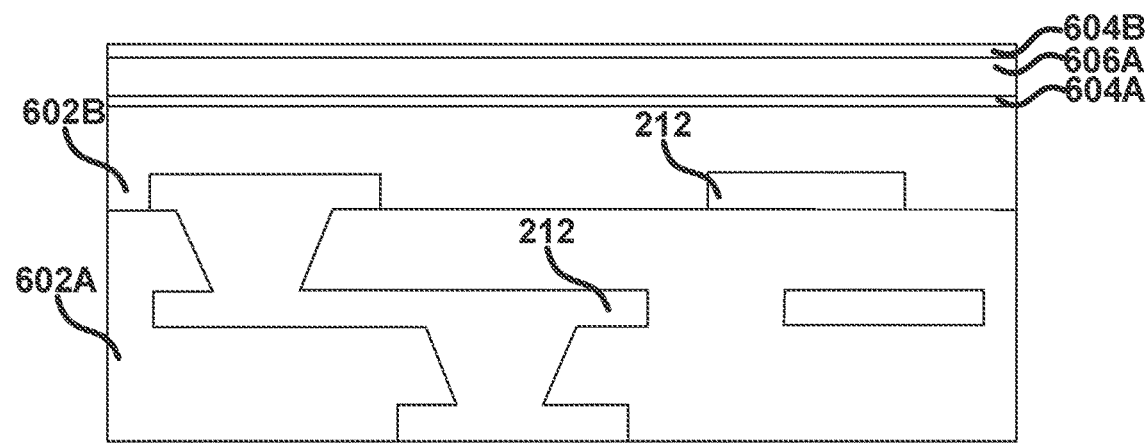
Figure 6D:
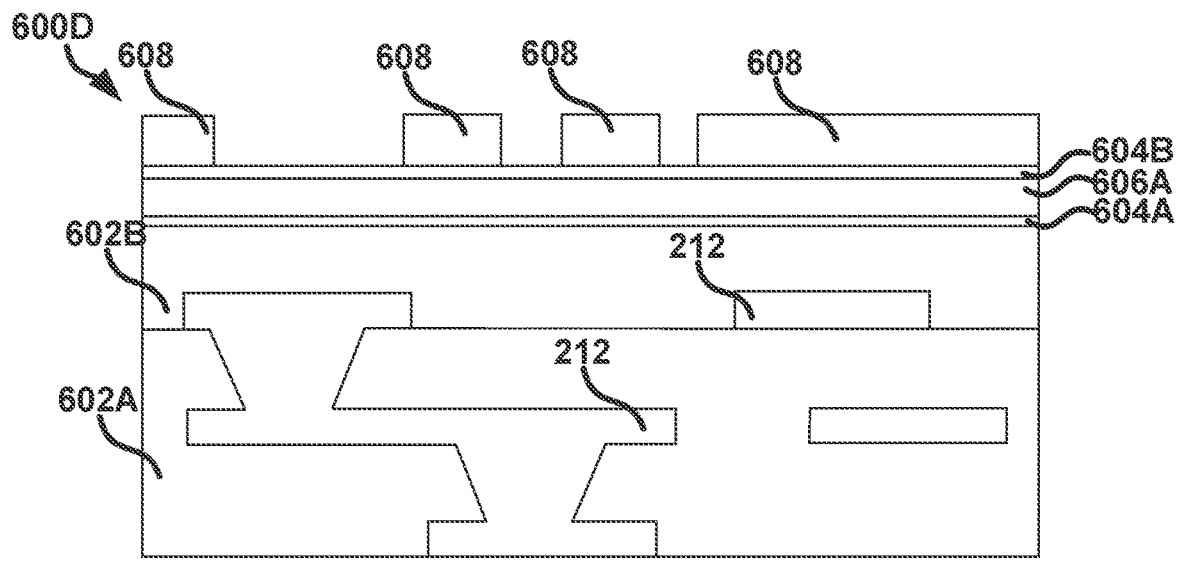
Figure 6E:
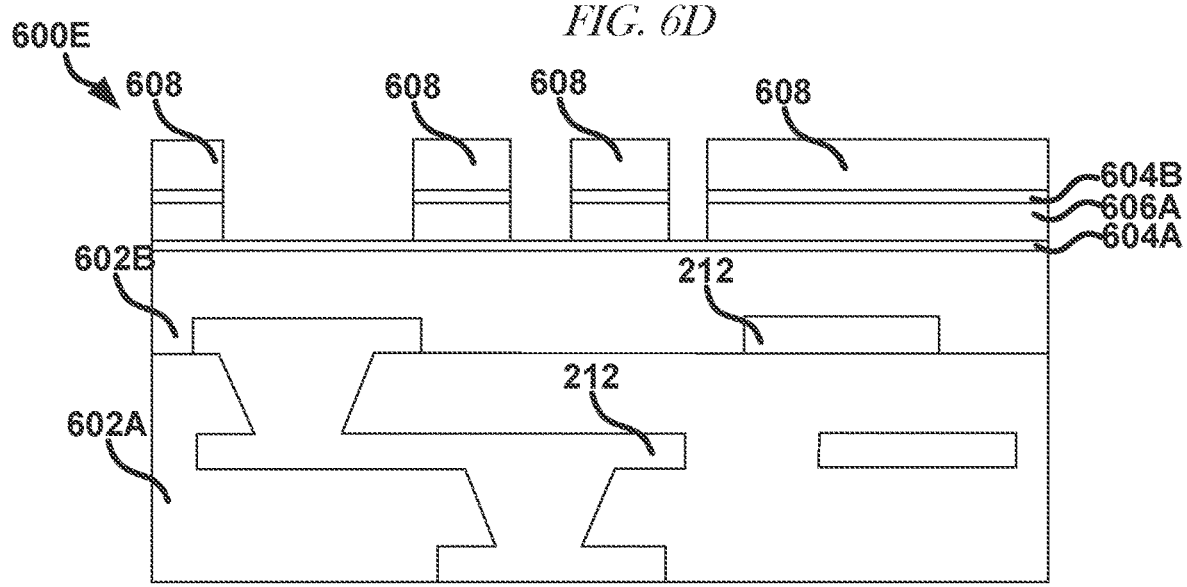
Figure 6F:
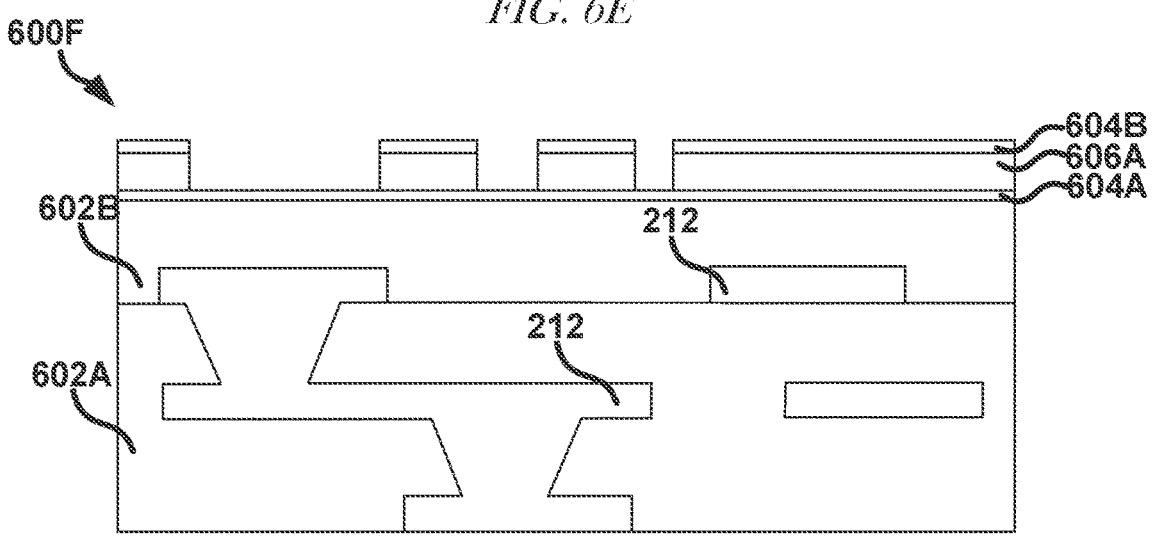
Figure 6G:
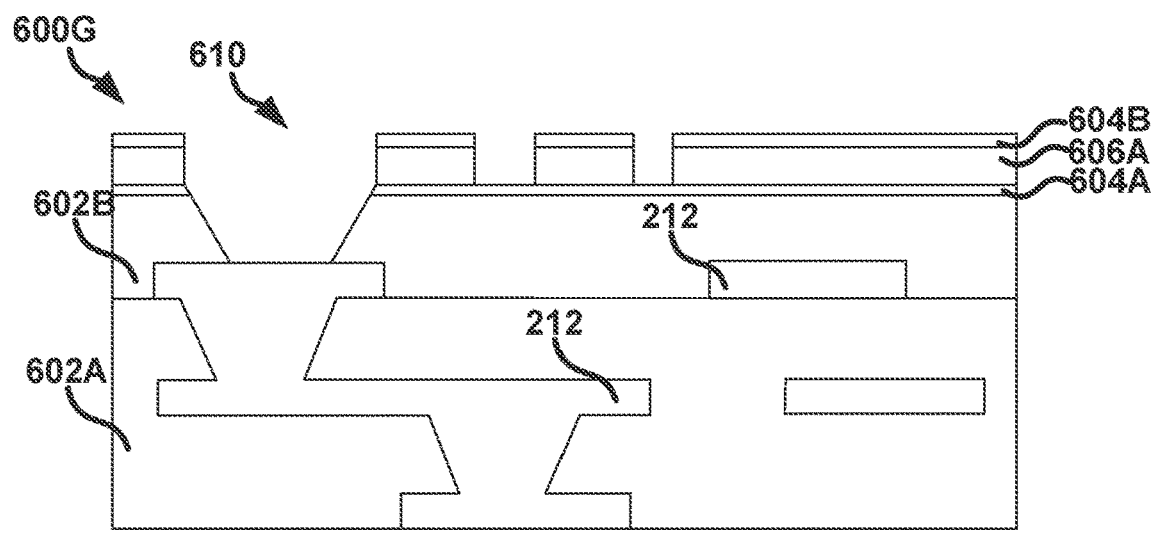
Figure 6H:
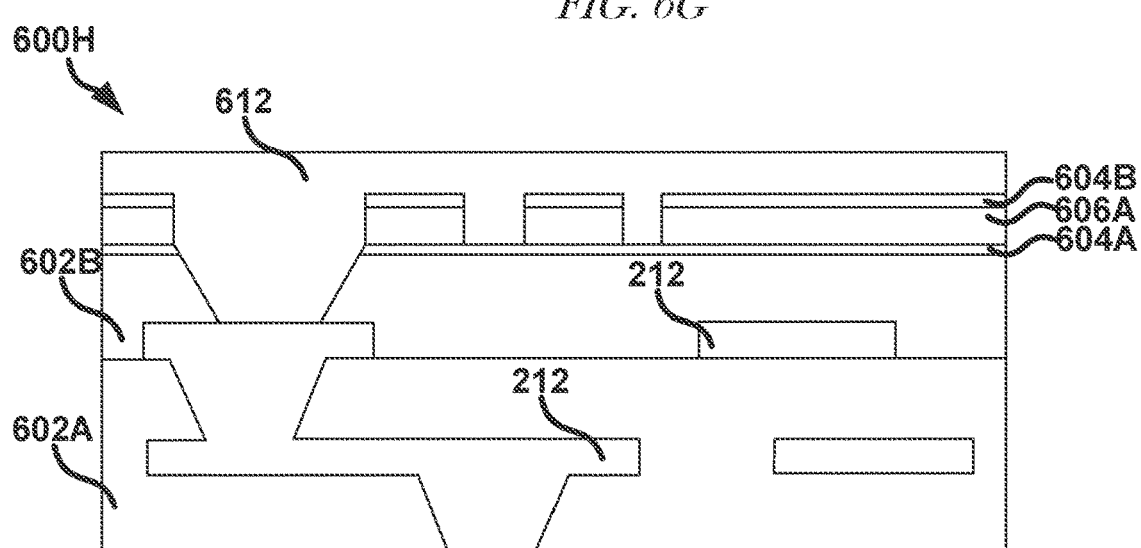
Figure 6I:
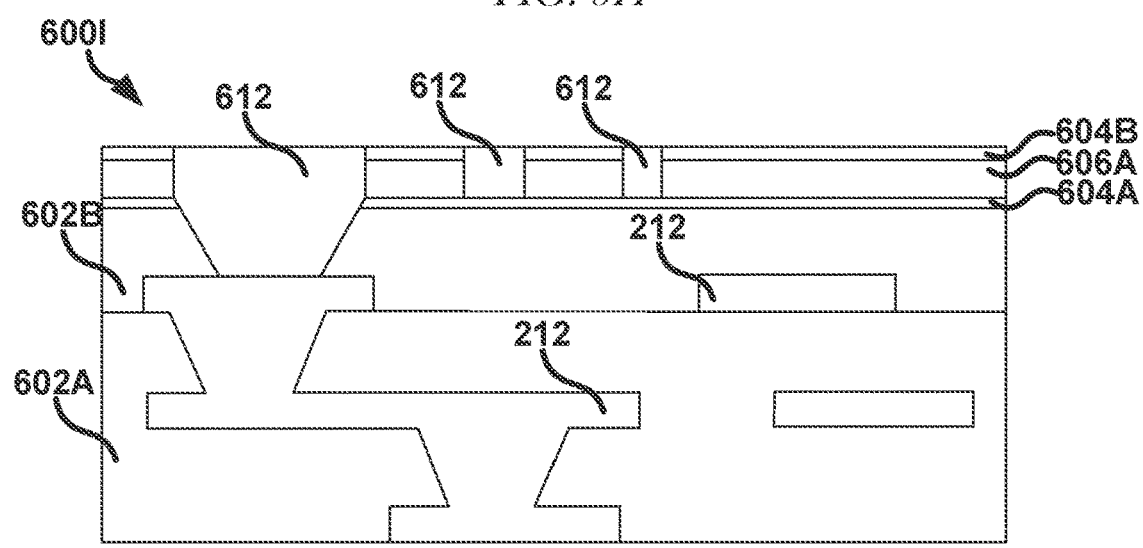
Figure 6J:
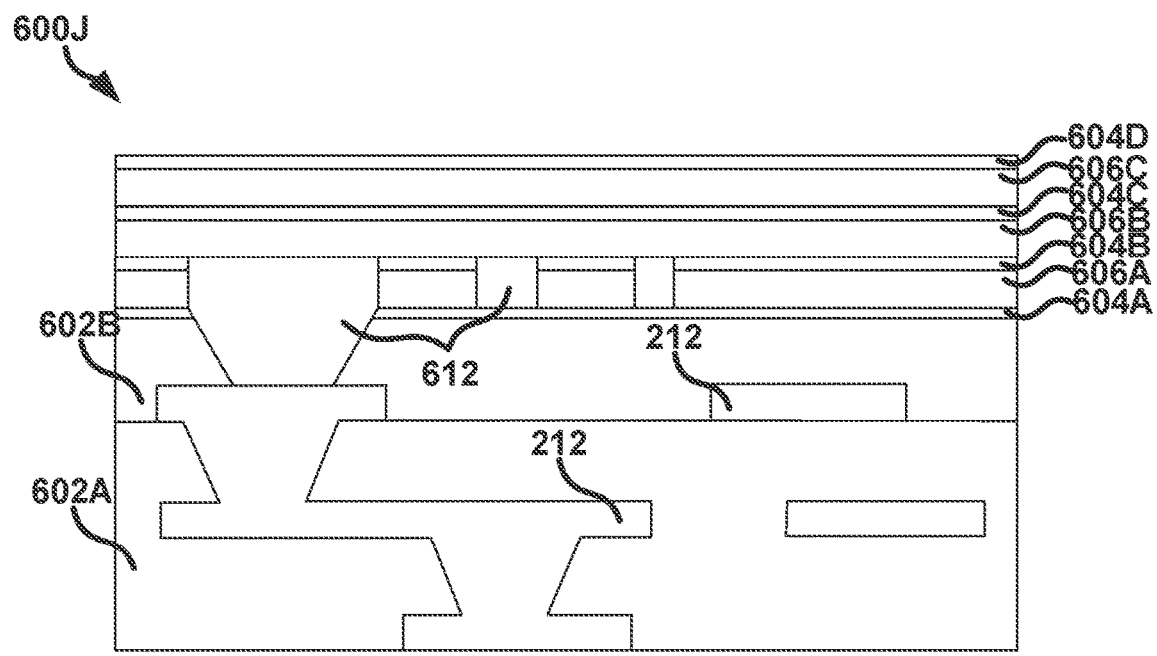
Figure 6K:
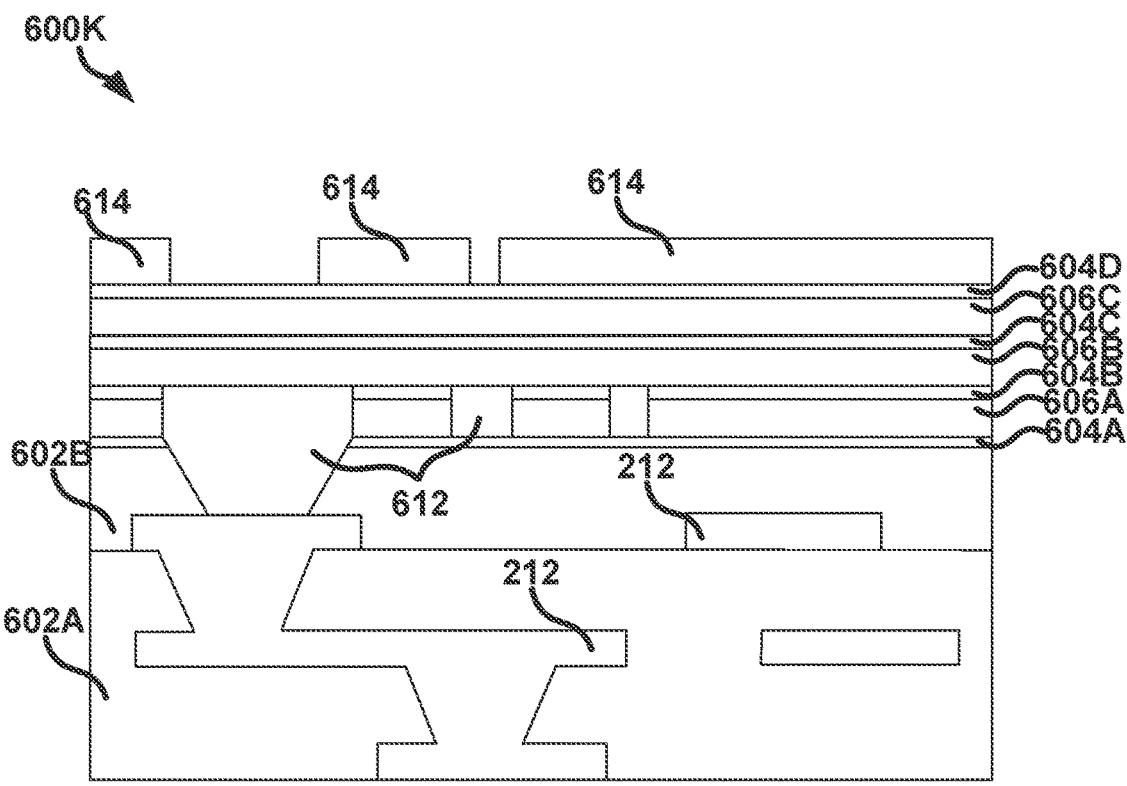
Figure 6L:
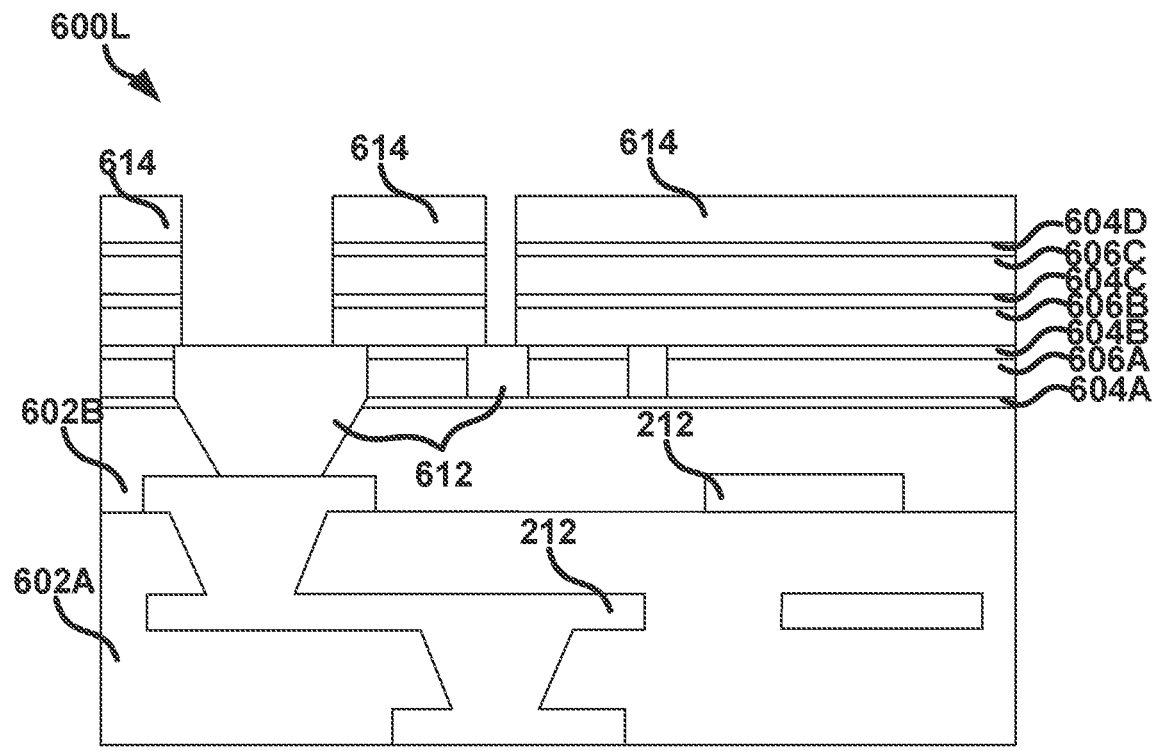
Figure 6M:
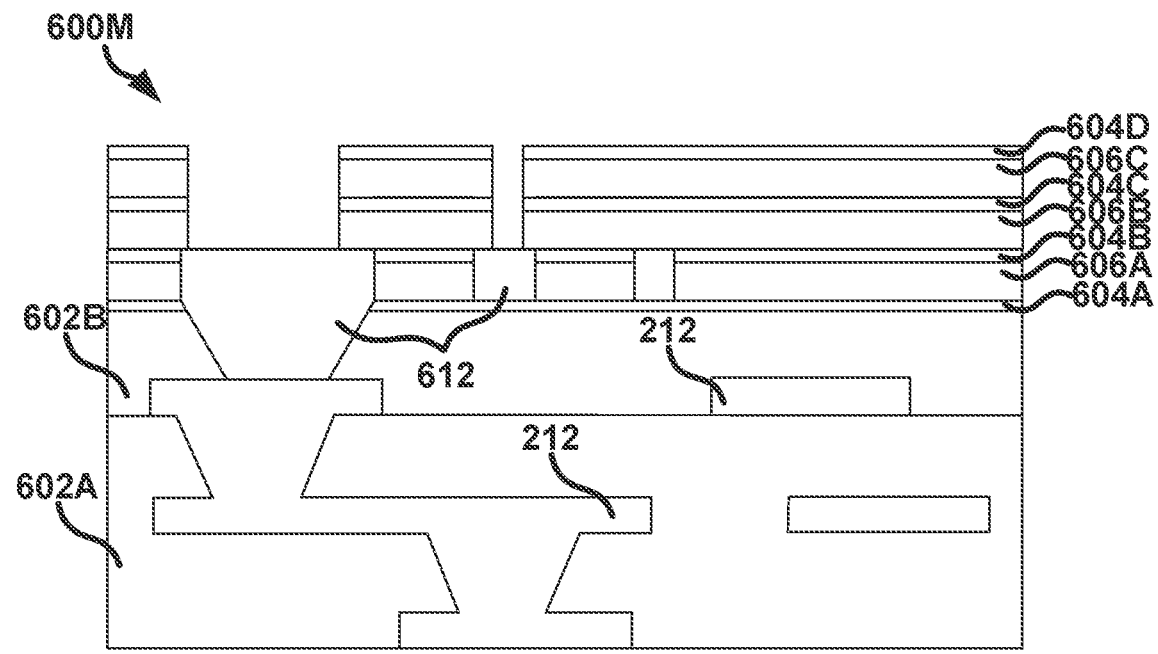
Figure 6N:
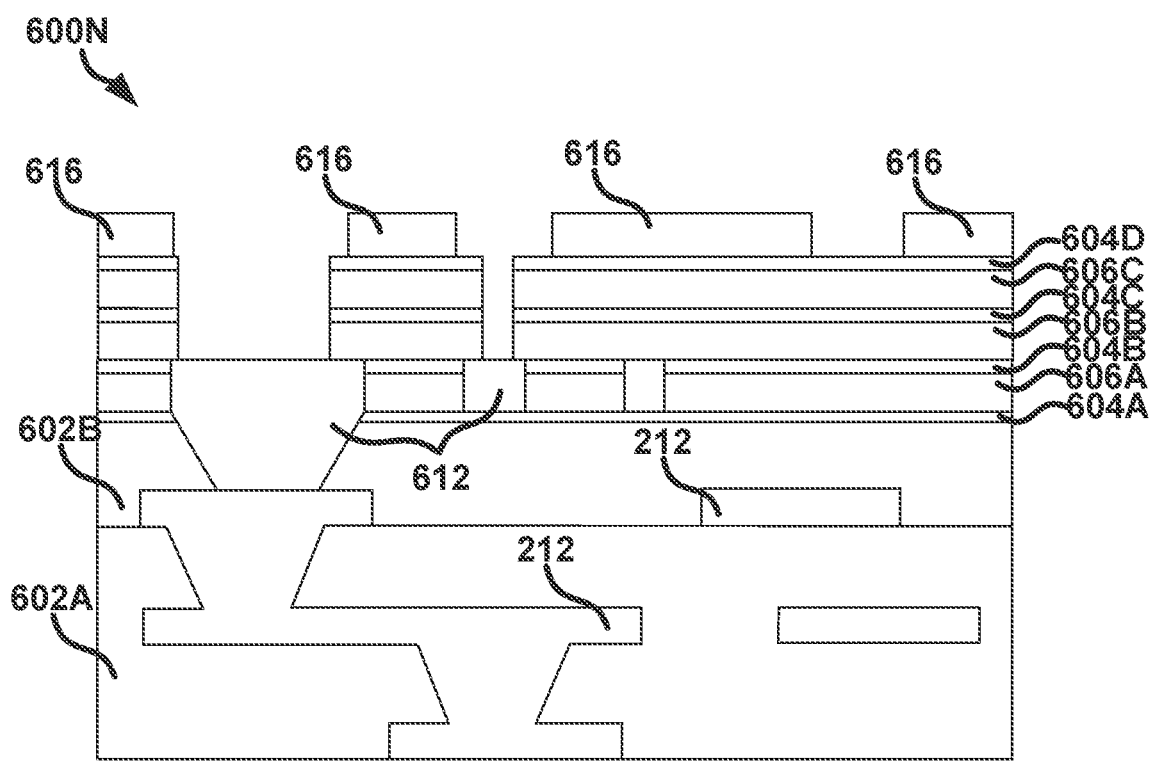
Figure 6O:
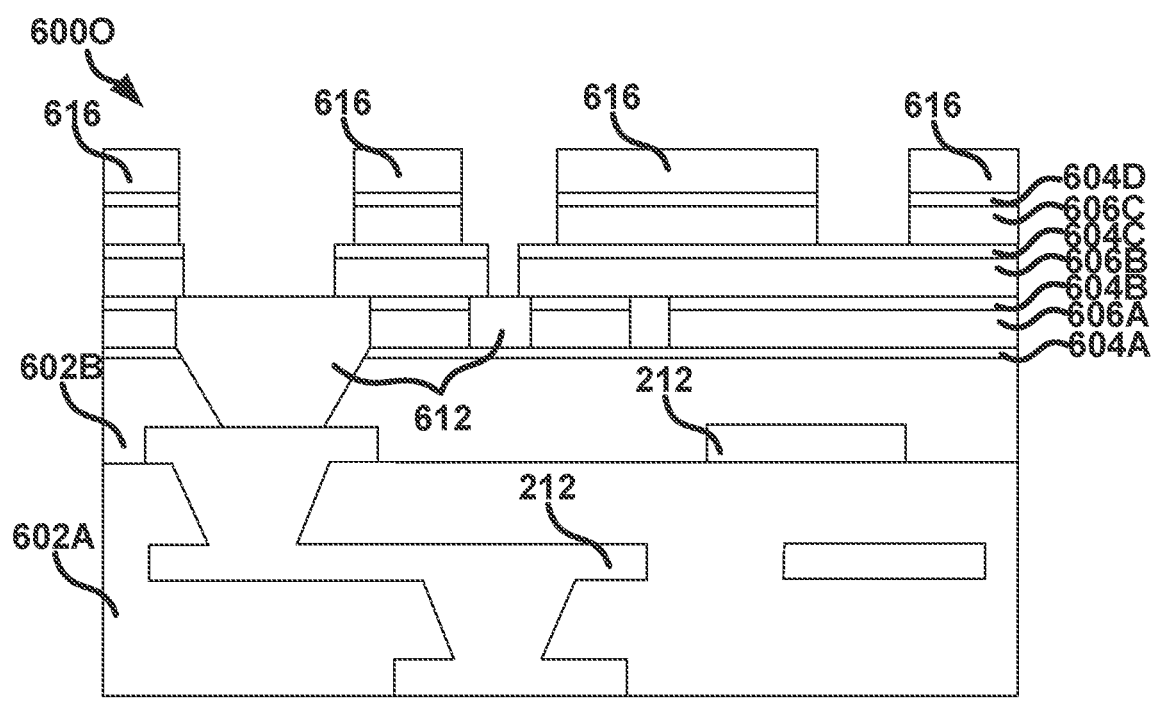
Figure 6P:
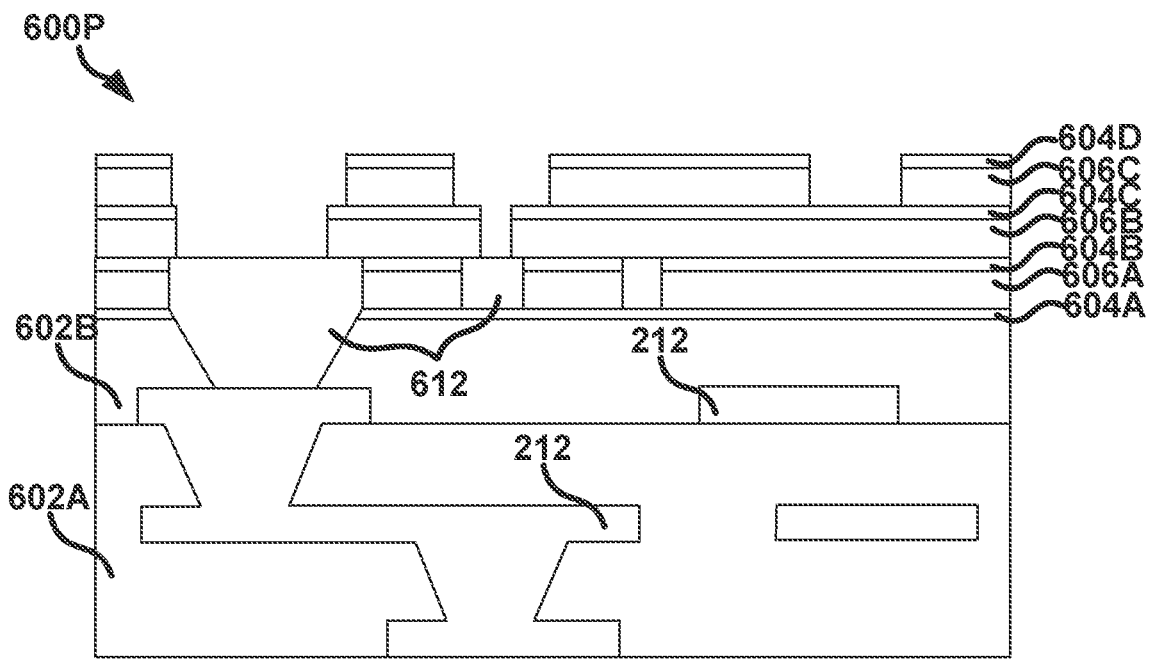
Figure 6Q:
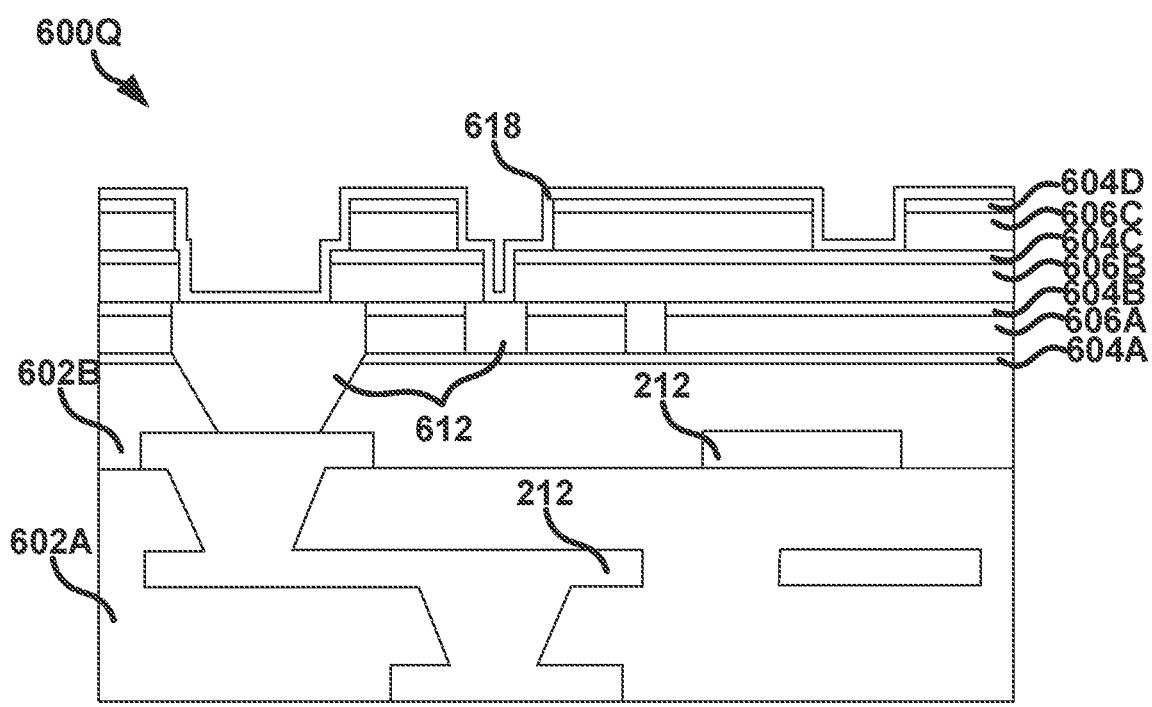
Figure 6R:
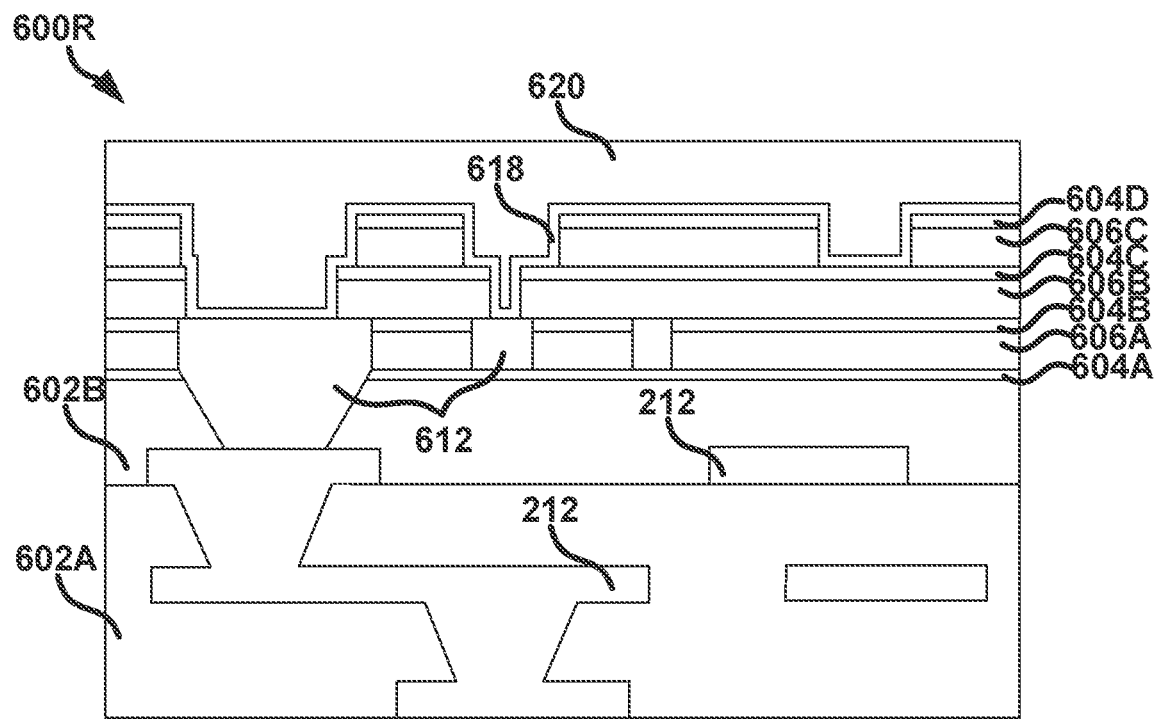
Figure 6S:
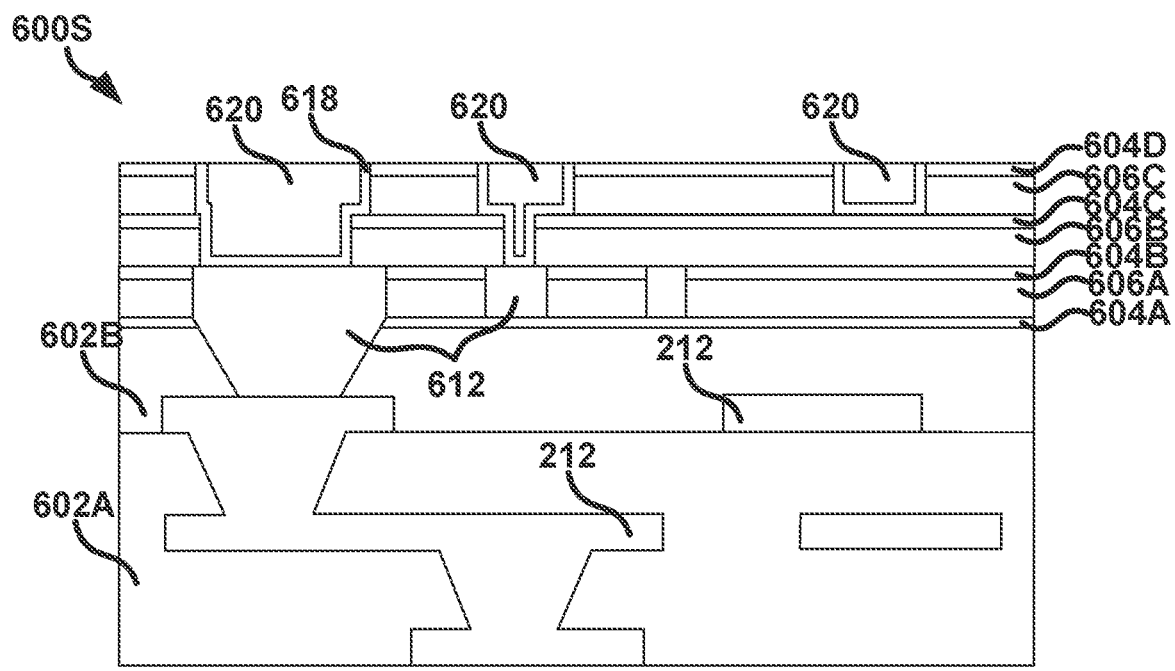
Figure 6T:
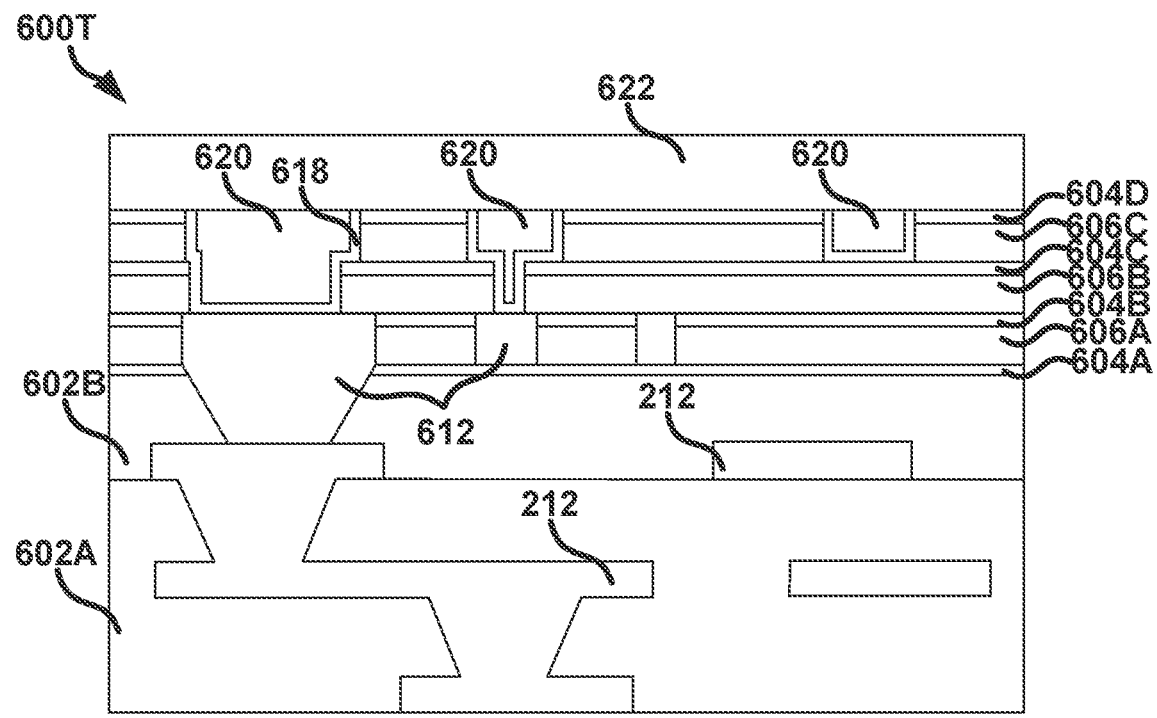
Figure 6U:
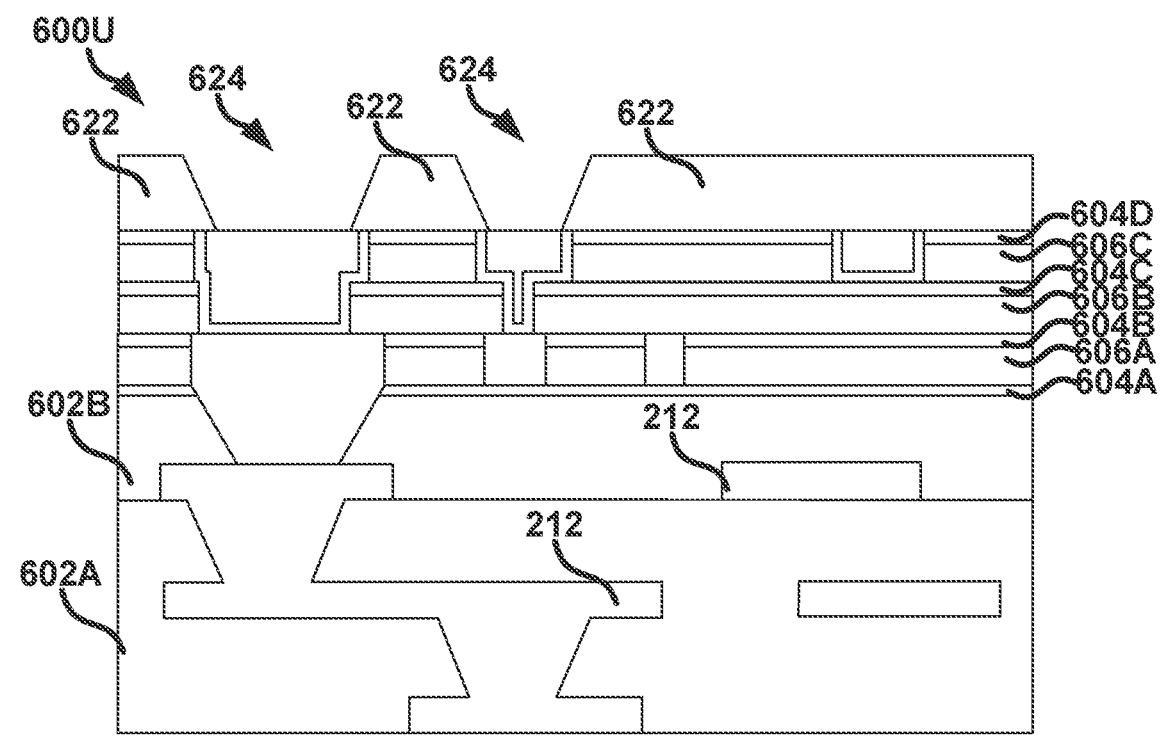

FIGS. 6A-6U illustrate, by way of example, cross-section diagrams of an embodiment of a process for creating an inorganic transition layer on a substrate using a damascene process. FIG. 6A shows a device 600A that includes the low density interconnect circuitry 212 within buildup layers 602A. Another buildup layer 602B (e.g., an Ajimoto Buildup Film (ABF)) is laminated on the buildup layers 602A, as shown in the device 600B of FIG. 6B. A transition layer is created on the buildup layers after all the buildup layers are formed. The transition layer is the layer that connects high density interconnect circuitry to low density interconnect circuitry. The transition layer is the layer of the inorganic interposer that is generally in contact with the substrate.

Current PECVD equipment is capable of depositing more than five micrometers of silicon oxide with cost effective throughput times. The inorganic transition layer process flow begins after the standard buildup layers are formed on a typical substrate panel (e.g., ABF film layers are laminated and processed to form the substrate 206 that includes low density interconnect circuitry therein).

Due to the about twelve to fifteen micrometer plated copper thicknesses, a transition layer is required between the standard buildup layers and the thin film layers. This is accomplished by a final ABF lamination followed by PECVD deposition of silicon nitride, silicon oxide, and silicon nitride. The first silicon nitride layer serves as a plasma etch stop, such as to protect the substrate 206 or other material below the silicon nitride. The silicon oxide deposition creates a dielectric layer, and a final silicon nitride deposition serves as the etch stop for a subsequent dielectric layer.

FIG. 6C shows a device 600C that includes the device 600B after a silicon nitride material 604A, a silicon oxide material 606A, and another silicon nitride material 604B are deposited thereon. A damascene process is then used to create the connections to the buildup layer routing as well as create any necessary patterning in the silicon oxide layer. A highly anisotropic etch is used to plasma etch the silicon nitride and silicon oxide. FIG. 6D shows a device 600D that includes the device 600C with etch resist material 608 patterned on the silicon nitride material 604B. FIG. 6E shows a device 600E that includes the device 600D after the anisotropic etch to remove portions of the silicon nitride 604B and the silicon oxide 606A exposed by the etch resist material 608.

The operations illustrated in FIGS. 6F and 6G are interchangeable, in that the operation illustrated in FIG. 6G can be performed before or after the operation illustrated in FIG. 6F. The device 600F of FIG. 6F includes the device 600E with the etch resist material 608 stripped therefrom. The device 600G of FIG. 6G includes the device 600F with a via hole 610 laser drilled through the silicon nitride material 604A-B, the silicon oxide 606, and into the buildup layer 602B.

A seed material is sputtered on exposed portions of the silicon nitride 404A-B, interconnect circuitry 212, the silicon oxide 606A, and the buildup layer 602B (seed material not shown in the FIGS., see FIGS. 4C, 4M, 5A, and 5J for examples of a seed material sputtered on a device). Conductive material 612 is electroplated on the seed material to form the device 600H of FIG. 6H. A chemical and/or mechanical polish is used to planarize the conductive material 612, remove excess conductive material and seed material, and/or electrically isolate conductive material, such as is shown in the device 600I of FIG. 6I. After the transition layer is completed, a via-first dual damascene process can then continue to be used to form high density interconnect circuitry in the inorganic interposer layers. Silicon nitride acts as an etch stop for the plasma etch, and selectivity for silicon oxide and silicon nitride is controlled by the plasma chemistries. For I/O, signal, and ground routed straight to the buildup layers, vias can be formed through the interposer layers.

FIG. 6J shows the device 600I after a silicon oxide material 606B, a silicon nitride material 604C, another silicon oxide material 606C, and another silicon nitride material 604D are deposited thereon to form the device 600J. FIG. 6K illustrates a device 600K that includes the device 600J with an etch resist material 614 (e.g., a photoresist material) patterned on the silicon nitride 604D. The device 600L of FIG. 6L shows the device 600K after an anisotropic etch is used to remove exposed portions of the silicon nitride 604D and the silicon oxide 606B-C and silicon nitride 604C under the silicon nitride 604D. The resist material 614 of the device 600L is stripped to form the device 600M of FIG. 6M. Trenches are patterned on the device 600M using etch resist material 616 as shown in device 600N of FIG. 6N. Portions of the silicon nitride 604D and the silicon oxide 606C are etched to form a device 600O of FIG. 6O that includes the patterned trenches.

The etch resist material 616 is stripped from the device 600O to form the device 600P of FIG. 6P. A conductive seed material 618 is deposited on exposed portions of the conductive material 612, the silicon nitride 604C-D, and the silicon oxide 606B-C of the device 600P to form the device 600Q of FIG. 6Q. FIG. 6R shows a device 600R that includes the device 600Q with an electrically conductive material 620 electrolytically plated on the seed material 618. The conductive material 620 of the device 600R is chemically and/or mechanically polished to remove portions of the conductive material 620 and form the device 600S of FIG. 6S. The process can continue with more high density routing as shown in FIGS. 6C-6S or a surface finish material 622 can be deposited on the device 600S to form the device 600T of FIG. 6T. One or more solder holes 624 can be formed in the surface finish material 622 to provide access to the high density routing in the inorganic interposer and to the low density routing in the substrate 206 (e.g., the buildup layers 602A-B) as shown in device 600U of FIG. 6U. One or more dice can be electrically connected to the device 600U, such as by soldering the dice to the device 600U through the holes 624.

FIGS. 6A-6U present a dual damascene process flow where the inorganic interposer is created on top of the substrate buildup layers. Known etching techniques will allow for sub-micron patterning in the inorganic interposer if necessary compared to the current lower limit of three microns for organic materials. Additionally, high aspect ratio trenches and vias can be created with typical side wall angles between 85 degrees and 89 degrees. These angles for the damascene process are generally greater than the same angles possible using an additive or a subtractive process. One of ordinary skill in the art can discern if a dual damascene process or an additive or subtractive process was used to create an inorganic interposer using electron microscopy to visualize these side walls and their angles. Due to the high copper thickness uniformity resulting from the damascene process compared to the semi-additive process used in organic interposer manufacturing as well as attainable high aspect ratio features, extremely tight pitch can be achieved without sacrificing copper thickness. Consequently, low resistance traces will be possible due to the thick copper lines. This process also provides electromigration barriers on all traces sides which will become important as trace pitch is scaled to very small dimensions.

The processes described with regard to FIGS. 4A-4S, 5A-5M and 6A-6U are generally used to create high density routing in an inorganic interposer. The seed material and the conductive material are the materials that form the interconnect circuitry. The high density interconnect circuitry created can include about a three to five micrometer thickness, a one to two micrometer width, and/or about a two to four micrometer space between interconnect circuitry (e.g., traces, vias, etc.).

Figure 7:
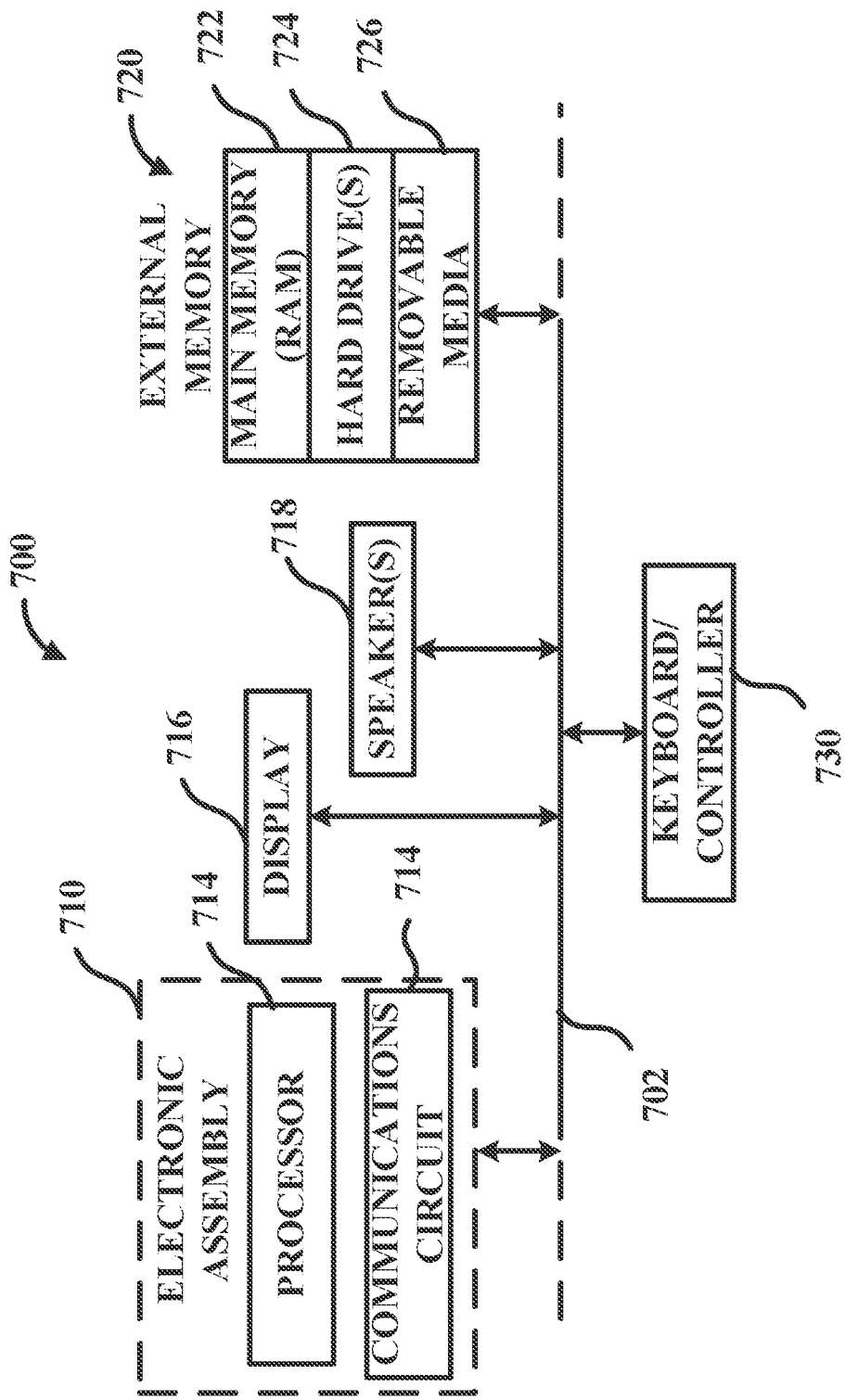
FIG. 7 shows a block diagram example of an electronic device which can include a multi-chip package as disclosed herein.

FIG. 7 shows a block diagram example of an electronic device which can include a multi-chip package as disclosed herein. An example of an electronic device using one or more packages with one or more inorganic interposers is included to show an example of a device application for the present disclosure. FIG. 7 shows an example of an electronic device 700 incorporating an inorganic interposer. Electronic device 700 is merely one example of a device in which embodiments of the present disclosure can be used. Examples of electronic devices 700 include, but are not limited to, personal computers, tablet computers, supercomputers, servers, telecommunications switches, routers, mobile telephones, personal data assistants, MP3 or other digital music players, radios, etc. In this example, electronic device 700 comprises a data processing system that includes a system bus 702 to couple the various components of the system. System bus 702 provides communications links among the various components of the electronic device 700 and can be implemented as a single bus, as a combination of busses, or in any other suitable manner.

An electronic assembly 710 is coupled to system bus 702. The electronic assembly 710 can include a circuit or combination of circuits. In one embodiment, the electronic assembly 710 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 710 are a custom circuit, an application-specific integrated circuit (ASIC), or the like, such as, for example, one or more circuits (such as a communications circuit 714) for use in wireless devices like mobile telephones, pagers, personal data assistants, portable computers, two-way radios, and similar electronic systems. The IC can perform any other type of function.

The electronic device 700 can include an external memory 720, which in turn can include one or more memory elements suitable to the particular application, such as a main memory 722 in the form of random access memory (RAM), one or more hard drives 724, and/or one or more drives that handle removable media 726 such as compact disks (CD), digital video disk (DVD), and the like.

The electronic device 700 can also include a display device 716, one or more speakers 718, and a keyboard and/or controller 730, which can include a mouse, trackball, touch screen, voice-recognition device, or any other device that permits a system user to input information into and receive information from the electronic device 700.

ADDITIONAL NOTES AND EXAMPLES

In Example 1 a device can include a substrate including low density interconnect circuitry therein, an inorganic interposer on the substrate, the inorganic interposer including high density interconnect circuitry electrically connected to the low density interconnect circuitry, the inorganic interposer including inorganic materials, and two or more chips electrically connected to the inorganic interposer, the two or more chips electrically connected to each other through the high density interconnect circuitry.

In Example 2, the device of Example 1 includes, wherein the inorganic interposer includes a silicon nitride on the substrate and a silicon oxide on the silicon nitride.

In Example 3, the device of Example 2 includes, wherein the inorganic interposer further includes another silicon nitride on the silicon oxide.

In Example 4, the device of at least one of Examples 1-3 includes, wherein the high density interconnect circuitry includes line widths and line spaces less than about two microns.

In Example 5, the device of at least one of Examples 1-4 includes, wherein the inorganic interposer includes a dual damascene substrate.

In Example 6, the device of at least one of Examples 1-5 includes, wherein the inorganic interposer includes a conductive seed material between a circuit layer and a buildup layer.

In Example 7, the device of at least one of Examples 1-6 includes, wherein the two or more chips includes a logic chip and a memory chip.

In Example 8 a method of forming an inorganic interposer includes depositing an inorganic material on a substrate, the substrate including low density interconnect circuitry therein, situating etch resist material on the inorganic material, etching the inorganic material exposed by the etch resist material, depositing a seed layer after etching, and electroplating copper onto the seed layer.

In Example 9, the method of Example 8 includes, wherein the inorganic material is one of a plurality of inorganic materials including silicon nitride and silicon oxide and the inorganic interposer is built using a damascene process comprising depositing first silicon nitride on a substrate, the substrate including low density interconnect circuitry therein, depositing silicon oxide on the first silicon nitride, depositing second silicon nitride on the silicon oxide, situating etch resist material on the second silicon nitride, etching the second silicon nitride and the silicon oxide exposed by the etch resist material, depositing a seed layer after etching, and electroplating copper onto the seed layer.

In Example 10, the method of Example 9 includes laser drilling a via hole in the substrate before depositing the seed layer.

In Example 11, the method of Example 9 includes removing electroplated copper to expose etched second silicon nitride.

In Example 12, the method of Example 11 includes depositing a second silicon oxide on the second silicon nitride, and a third silicon nitride on the second silicon oxide.

In Example 13, the method of Example 12 includes situating second etch resistant material on the third silicon nitride, and etching exposed portions of the second silicon oxide and the third silicon nitride to expose portions of the electroplated copper.

In Example 14, the method of Example 13 includes depositing a second seed layer on the third silicon nitride and the exposed portions of the electroplated copper, and electroplating copper onto the second seed layer.

In Example 15, the method of Example 8 includes building up the inorganic interposer using a semi-additive process including depositing an oxide on a buildup layer, situating third etch resist material on the oxide, etching portions of the oxide and the buildup layer exposed by the etch resistant material to expose the portions of the buildup layer and low density interconnect circuitry of the substrate, sputtering a seed layer on the exposed low density interconnect circuitry and portions of the buildup layer, situating a pattern plating resist material on the seed layer, electroplating copper on portions of the seed layer exposed by the pattern plating etch resist material, stripping the pattern plating resist material, and depositing another oxide material on exposed surfaces of the copper and the buildup layer.

In Example 16, the method of Example 8 includes building up the inorganic interposer using a subtractive process including depositing an oxide on a buildup layer, situating third etch resist material on the oxide, etching portions of the oxide and the buildup layer exposed by the etch resistant material to expose the portions of the buildup layer and low density interconnect circuitry of the substrate, sputtering a seed layer on the exposed low density interconnect circuitry and portions of the buildup layer, electroplating copper on the seed layer, situating fourth etch resist material on the electroplated copper, etching exposed portions of the electroplated copper to the buildup layer, stripping the fourth etch resist material, and depositing another oxide material on exposed surfaces of the copper and the buildup layer.

In Example 17 a device includes a substrate including low density interconnect circuitry therein, an inorganic interposer on the substrate, the inorganic interposer including high density interconnect circuitry electrically connected to the low density interconnect circuitry, the inorganic interposer including alternating layers of inorganic materials, two or more chips electrically connected to the inorganic interposer, the two or more chips electrically connected to each other through the high density interconnect circuitry, and a surface finish layer situated between the transition layer and the two or more chips.

In Example 18, the device of Example 17 includes wherein the inorganic materials include a silicon nitride and a silicon oxide.

In Example 19, the device of Example 18 includes, wherein the high density interconnect circuitry includes line widths and line spaces less than about two microns.

In Example 20, the device of at least one of Examples 17-19 includes wherein the two or more chips includes a logic chip and a memory chip.

The above description of embodiments includes references to the accompanying drawings, which form a part of the description of embodiments. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A multi-chip device comprising:
   a substrate including low density interconnect circuitry therein;
   an inorganic interposer on and in contact with the substrate, the inorganic interposer including high density interconnect circuitry, the high density interconnect circuitry electrically connected to the low density interconnect circuitry, the inorganic interposer including the high density interconnect circuitry in first and second stacks of inorganic materials, and each of the first and second stacks of inorganic materials including a silicon nitride and a silicon oxide on and in contact with the silicon nitride, the silicon nitride of the first stack on and in contact with a surface of the substrate and the silicon nitride of the second stack on and in contact with a surface of the silicon oxide of the first stack; and
   two or more chips electrically connected to the inorganic interposer, the two or more chips directly electrically connected to each other through the high density interconnect circuitry.

2. The device of claim 1, wherein the inorganic interposer further includes another silicon nitride on and in contact with the silicon oxide.

3. The device of claim 1, wherein the high density interconnect circuitry includes line widths and line spaces less than about two microns.

4. The device of claim 1, wherein the inorganic interposer includes a dual damascene substrate.

5. The device of claim 1, wherein the inorganic interposer includes a conductive seed material between a circuit layer and a buildup layer.

6. The device of claim 1, wherein the two or more chips includes a logic chip and a memory chip.

7. A device comprising:
   a substrate including low density interconnect circuitry therein;
   an inorganic interposer on the substrate, the inorganic interposer including high density interconnect circuitry, the high density interconnect circuitry electrically connected to the low density interconnect circuitry, the inorganic interposer including the high density interconnect circuitry in first and second stacks of alternating layers of inorganic materials, each of the first and second stacks of inorganic materials including a silicon nitride on and in contact with a silicon oxide, the silicon nitride of the first stack on and in contact with a surface of the substrate and the silicon nitride of the second stack on and in contact with a surface of the silicon oxide of the first stack;
   two or more chips electrically connected to the inorganic interposer, the two or more chips directly electrically connected to each other through the high density interconnect circuitry; and
   a surface finish layer situated between the silicon oxide of the second stack and the two or more chips.

8. The device of claim 7, wherein the high density interconnect circuitry includes line widths and line spaces less than about two microns.

9. The device of claim 7, wherein the two or more chips includes a logic chip and a memory chip.

\* \* \* \* \*